United States Patent
Ohmi et al.

[11] Patent Number: 6,051,851
[45] Date of Patent: Apr. 18, 2000

[54] SEMICONDUCTOR DEVICES UTILIZING SILICIDE REACTION

[75] Inventors: Tadahiro Ohmi, Sendai; Mamoru Miyawaki, Isehara; Yoshio Nakamura, Atsugi; Hiroshi Suzuki, Sendai; Takeo Yamashita, Oume, all of Japan

[73] Assignees: Canon Kabushiki Kaisha, Tokyo; Tadahiro Ohmi, Niyagi-ken, both of Japan

[21] Appl. No.: 08/917,675

[22] Filed: Aug. 26, 1997

Related U.S. Application Data

[63] Continuation of application No. 08/429,043, Apr. 26, 1995, abandoned.

[30] Foreign Application Priority Data

Apr. 28, 1994 [JP] Japan .................................. 6-090921

[51] Int. Cl.[7] ................ H01L 31/0328; H01L 31/0336; H01L 31/072; H01L 31/109
[52] U.S. Cl. ......................... 257/185; 257/529; 257/530
[58] Field of Search ................... 257/185, 529, 257/530

[56] References Cited

U.S. PATENT DOCUMENTS

| | | | |
|---|---|---|---|
| 4,499,557 | 2/1985 | Holmberg et al. | 365/163 |
| 4,569,121 | 2/1986 | Lim et al. | |
| 4,670,970 | 6/1987 | Bajor | 29/584 |
| 4,748,490 | 5/1988 | Hollingsworth | 357/51 |
| 5,258,657 | 11/1993 | Shibata et al. | 307/201 |
| 5,272,666 | 12/1993 | Tsang et al. | 365/96 |
| 5,329,153 | 7/1994 | Dixit | 257/530 |
| 5,331,197 | 7/1994 | Miyawaki et al. | 257/530 |
| 5,428,237 | 6/1995 | Yuzurihara et al. | 257/349 |

FOREIGN PATENT DOCUMENTS

| | | |
|---|---|---|
| 0455414 | 11/1991 | European Pat. Off. |
| 0501687 | 9/1992 | European Pat. Off. |
| 56-103474 | 8/1981 | Japan |
| 62-49651 | 3/1987 | Japan |
| 36679 | 1/1991 | Japan |
| WO9216976 | 10/1992 | WIPO |

OTHER PUBLICATIONS

Wang, et al. "High Performance Metal/Silicide Antifuse", IEEE Electron Device Letters, 13, 471–72 (1992).

(List continued on next page.)

*Primary Examiner*—Stephen D. Meier
*Attorney, Agent, or Firm*—Fitzpatrick, Cella, Harper & Scinto

[57] ABSTRACT

Cheap semiconductor memory devices are provided so as to enable high-speed writing and reading but rarely to malfunction, thus being high in reliability. In a semiconductor device which comprises a plurality of cells each having a semiconductor layer between a pair of conductors, at least one of the pair of conductors is made of a metal, and the semiconductor layer comprises an amorphous silicon that can form a silicide region with the metal as reacting at a reaction rate of not less than 10 m/sec. Another device is characterized in that the semiconductor layer is an amorphous silicon, in that at least one of the pair of conductors is made of a metal silicide-reacting with the amorphous silicon, and in that the silicide region formed is conic. Another device is characterized in that the semiconductor layer is an amorphous silicon, in that at least one of the pair of conductors is formed of a metal silicide-reacting with the amorphous silicon, and in that a film-formed surface is produced without being exposed to an oxide atmosphere, between a step of forming the amorphous silicon and a step of forming the metal.

69 Claims, 25 Drawing Sheets

OTHER PUBLICATIONS

Shacham–Diamond, "Filament Formation and the Final Resistance Modeling In Amorphous–Silicon Vertical Programmable Element", IEEE Transactions on Electron Devices, 40, 1993, 1780–88.

M. Takagi, et al. "A Highly Reliable Metal–to–Metal Antifuse for High–Speed Field Programmable Gate Arrays", Technical Digest, International Electron Devices Meeting, 1993, 2.7.1–2.7.4.

K. Gordon, et al., "Conducting Filament of the Programmed Metal Electrode Amorphous Silicon Antifuse," Technical Digest, International Electron Devices Meeting (1993), 2.6.1–2.6.4.

T. Shibata, "A Functional Mos Transistor Featuring Gate–Level Weighted Sum and Threshold Operations," IEEE Transactions on Electron Devices, vol. 39, 1992, p. 1444–1455.

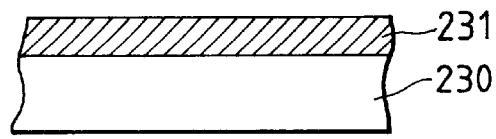
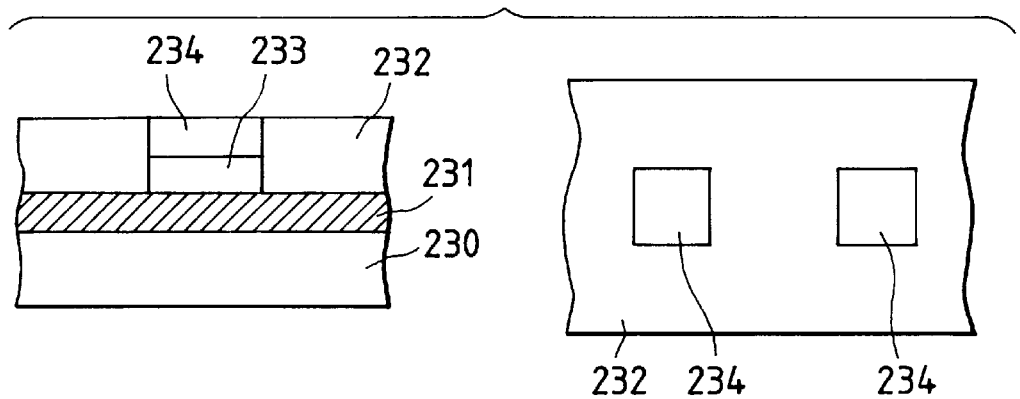
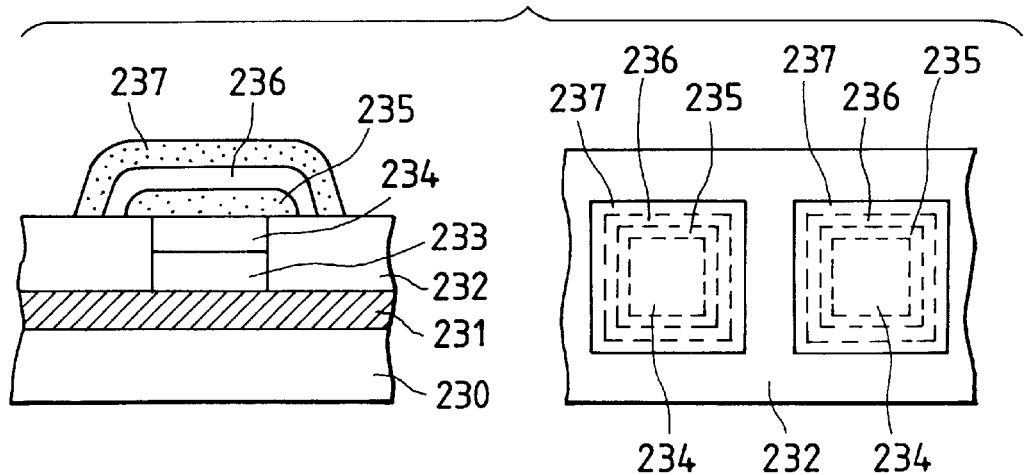

$\overline{A} \cdot B + A \cdot \overline{B}$
(XOR)

SEMICONDUCTOR DEVICES UTILIZING SILICIDE REACTION

This application is a continuation of application Ser. No. 08/429,043 filed Apr. 26, 1995, which is now abandoned.

BACKGROUND OF THE INVENTION

1. Field of the Invention

The present invention relates to semiconductor memory devices, provides a means for electrically coupling a line to another line by a reaction induced by electric current or heat, and provides a variety of high-level function semiconductor devices, including high-integration and high-speed read only memories and high-speed field programmable devices.

2. Related Background Art

A mask in process normally determines which line is interconnected or disconnected to which line in LSI, and the connection of lines determines a function of the circuit. Circuits fabricated in this manner, however, each have a uniquely determined function after IC integrated circuit ("IC") process, and cannot be diverted to other purposes. Thus, circuits have to be fabricated individually depending upon their purpose. Accordingly, such circuits could not be mass produced. Also, a mask for determining the wire connection needs to be designed for every IC, which extends the time from design to fabrication.

If connection and insulation of wiring between arithmetic elements can be arbitrarily determined after completion of the IC process, it becomes possible preliminarily to mass-produce devices and circuit functions are written by wiring connection depending upon their necessary functions. This will enable desired ICs to be supplied cheaply and quickly.

A fuse method and an antifuse method are conventional methods for arbitrarily determining connection and insulation between lines after completion of the IC process. The fuse method is a technique in which all line-to-line connections are first made effective with a fuse element (polysilicon) at the end of the IC process, and an interconnection is fused by electric current to bring an arbitrary portion into an insulated state. In this method, in some instances the fused polysilicon scatters around to cause malfunction of the device. Increasing the speed of the circuit operation is difficult because unfused polysilicon has a significant resistance.

The antifuse method is a technique for breaking down an insulator layer so as to couple a line with another line. Increasing the speed of the circuit operation is also difficult because of a high resistance after being connection. Further, the connecting part becomes a fuse after being connected, which could be fused and thus cannot secure a stable connecting state, resulting in low reliability.

There is thus a demand to achieve line connecting technology with low resistance after connection and with high reliability as an antifuse method free of dust. The antifuse method using amorphous silicon has been researched, but the voltage required to cause breakdown is still high, and the resistance after connection is not yet sufficiently lowered. There are also cases where an FN (Fowler-Nordheim) current starts flowing with application of an electric field so as to increase power consumption of the system in operation. Therefore, adequate performance has not yet been achieved.

On the other hand, the above connection technology can be used to realize a memory which can be written after completion of the IC process. After a movie, a video-file, a music-file, or the like is once written, it is only read out many times, but does not have to be rewritten. Thus, such a memory can be said to be a memory for exclusive use for reading.

Most of information of these movie, video-file, music-file, etc. is stored in magnetic tapes or compact disks. Methods using the magnetic tapes or compact disks, however, necessitate a mechanical structure for rotating a tape or disk at high speed while keeping a reading sensor in the proximity of a surface of the magnetic tape or disk. In these methods, it is difficult to miniaturize the reading device and to read out a large quantity of data at high speed, because the reading speed is determined by the speed of mechanical rotation. In addition, writing also takes a long time.

Thus, there is a demand for a compact recording medium which can permit reading and writing at higher speed than with magnetic media etc. and which does not require a mechanical rotating portion in a reading/writing apparatus.

As recording media, there are read only memories (ROMs) fabricated by the IC process and enabling electrical reading. These type of memories include mask ROMs in which information is stored by a mask in IC fabrication step, fuse ROMs in which information is stored by fusing the fuse element (polysilicon) with an electric current after fabrication of an IC chip, and antifuse ROMs in which information is stored by breaking down an insulator with an electric current to form a conductor.

However, in case of the mask ROMs for storing information with the mask in the IC fabrication process, a new mask needs to be fabricated in the accordance with the information to be written, so that a lot of time is needed before completing the product, and fabrication costs become high for a small number of products.

As described previously, because the fuse (high-resistance polysilicon) not fused suppresses an electric current flowing in a memory element storing "1" to a low level in the fuse ROM, high-speed reading is difficult. Further, there is the occurrence of malfunctions due to the generation of dust upon fusing the fuse. With the antifuse ROM storing information through breakdown of the insulator to form a conductor, lowering the resistance after breakdown Is difficult. Thus, an electric current flowing in a memory element storing "1" is reduced, resulting in a problem of difficulties of high-speed reading. Examples of the antifuse ROMs are disclosed in U.S. Pat. No. 4,499,557, reports by K. E. Gordon, R. J. Wong et al. ("CONDUCTING FILAMENT OF THE PROGRAMMED METAL ELECTRODE AMORPHOUS SILICON ANTIFUSE," IEDM 27–30, 1993), M. T. Takagi et al., "A High Reliable Metal to Metal Antifuse for High-Speed Field Programmable Gate Arrays," IEDM P31–34, 1993, Japanese Laid-open Patent Application No. 62-49651, Japanese Laid-open Patent Application No. 56-103474, etc.

As described above, the conventional technology cannot provide an increase in the speed of access of information required in the future or to provide high-quality semiconductor memories.

Particularly, the writing and reading speeds need to be further improved, and the likelihood of malfunctions (erroneous reading of information) needs to be further decreased.

SUMMARY OF THE INVENTION

An object of the present invention is to provide cheap and highly-reliable semiconductor memory devices which can write and read information at high speed with minimal malfunctions.

A semiconductor device utilizing the silicide reaction according to the present invention is a semiconductor device in which a plurality of cells each having a semiconductor layer between a pair of conductors are arranged, wherein at least one of the pair of conductors comprises a metal and wherein the semiconductor layer comprises an amorphous silicon that can undergo the silicide reaction with the metal at a reaction rate of not less than 10 m/sec so as to form a silicide region.

Another semiconductor device utilizing the silicide reaction according to the present invention is a semiconductor device in which a plurality of cells each having a semiconductor layer between a pair of conductors are arranged, having such a structure that the semiconductor layer comprises an amorphous silicon, that at least one of the pair of conductors comprises a metal to undergo the silicide reaction with the amorphous silicon, and that a silicide region to be formed becomes conical.

A further semiconductor device utilizing the silicide reaction according to the present invention is a semiconductor device in which a plurality of cells each having a semiconductor layer between a pair of conductors are arranged, wherein the semiconductor layer is formed of an amorphous silicon, at least one of the pair of conductors is formed of a metal to undergo the silicide reaction with the amorphous silicon, and a film-formed surface is produced without being exposed to an oxygen atmosphere between a step of forming the amorphous silicon and a step of forming the metal.

The present inventors intensively and extensively studied factors to hinder decreases of the breakdown voltage of antifuse and the resistance after connection, and found out that they were greatly affected by impurities including oxygen etc. present in the interface between the amorphous silicon and the metal. The present invention has been accomplished based on this finding.

In the present invention, the silicide region in which the silicide reaction proceeded at the reaction rate of not less than 10 m/sec is low in resistance and can stably maintain a conducting (breakdown) state for a long period.

Further, the amorphous silicon achieving the above reaction rate is high in resistance value and thus small in leakage current in a non-conducting (non-breakdown) state, and can decrease the chance of erroneous writing due to a writing (breakdown) operation for another cell.

Also, the silicide region in the cell, having a low resistance because of conduction (breakdown), is not formed in a shape in which crystal grains randomly gather, but in a conical or pyramid shape, and thus, the cell has a low conduction resistance and is kept in an electrically stable state.

Further, the semiconductor layer and the metal silicide-reacting with each other are continuously formed, that is, the processed substrate (film-formed surface) is not exposed to an oxygen atmosphere such as air during formation, so that it can easily form the conical silicide region having excellent interface characteristics at the reaction rate of not less than 10 m/sec.

If the device is arranged to satisfy a relation of R1>R2 and/or a relation of V1>V2 where R1 is a resistance of a semiconductor layer constituting a memory element as a conductible antifuse (hereinafter also referred to as a "first semiconductor region"), V1 is a silicide reaction rate of the semiconductor layer, R2 a resistance of a second semiconductor region by which a rectifier barrier for constituting a rectifier appears, and V2 is a silicide reaction rate of the second semiconductor region, a rectifying function can be maintained for a long period without being damaged.

BRIEF DESCRIPTION OF THE DRAWINGS

FIGS. 14A to 14C are diagrammatic drawings to show the semiconductor device of Embodiment 5;

DETAILED DESCRIPTION OF THE PREFERRED EMBODIMENTS

The preferred embodiments of the present invention will be described in detail.

Figure 1:
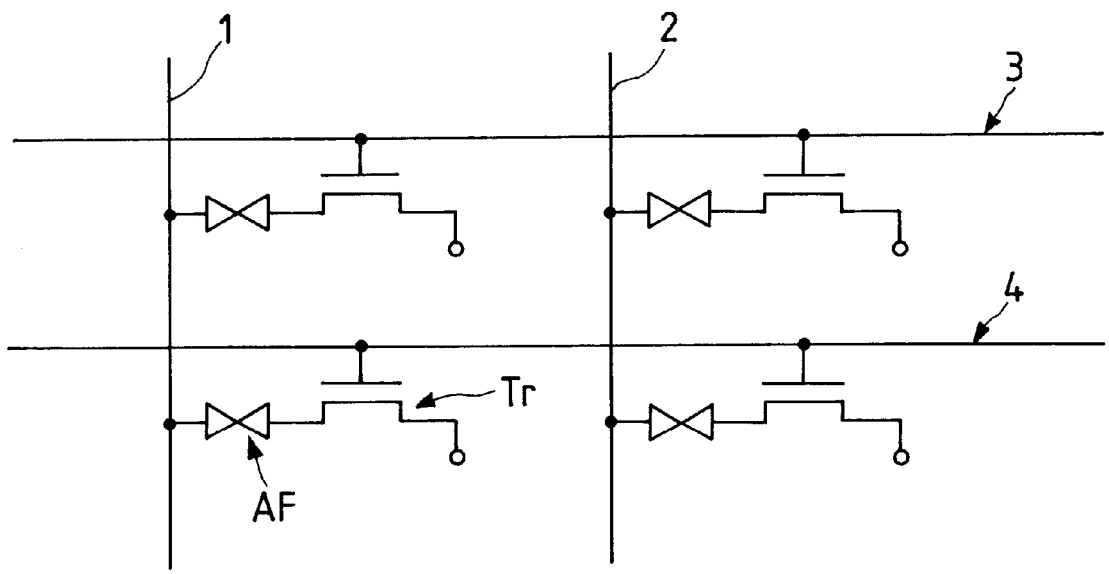
FIG. 1 is a circuit diagram to show an example of the semiconductor device of the present invention.

FIG. 1 is a circuit diagram to show an example of the semiconductor memory device of the present invention.

A cell for storing "0" or "1" is comprised of a memory element AF being a conductible antifuse and a MOS transistor Tr being a switch element provided a function. To each cell, reading or writing is made through selection of word line 3, 4 and selection of bit line 1, 2.

Figure 2:
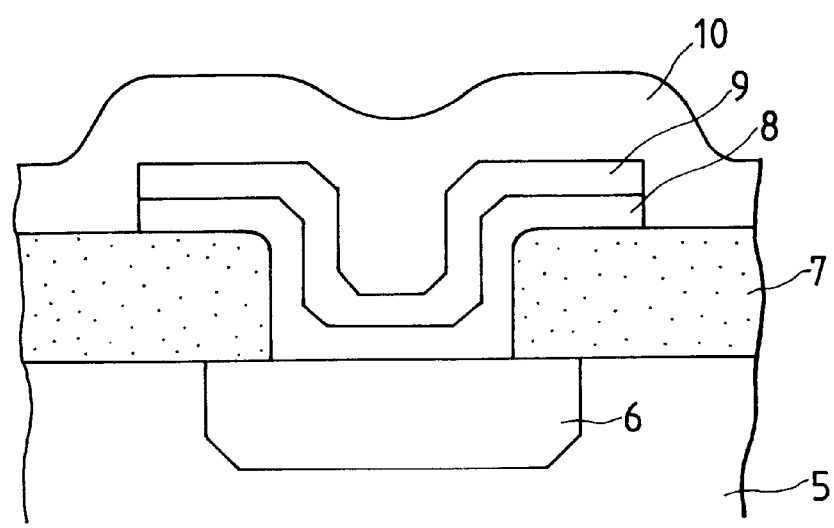
FIG. 2 is a diagrammatic cross section of an antifuse (memory element) of the present invention.

FIG. 2 is a diagrammatic cross section to show the structure of the memory element AF part shown in FIG. 1. In FIG. 2, reference numeral 5 designates a semiconductor base, which is constructed for example of a silicon substrate in which the MOS transistor etc. of FIG. 1 is formed. Numeral 6 denotes an $n^+$ drain region of the MOS transistor Tr, which is constructed of a phosphorus or arsenic doped silicon layer, for example. Numeral 7 represents an insulator film such as $SiO_2$. Numeral 8 is a semiconductor layer, which is formed in a contact hole in the insulator film 7 and which is in contact with the base $n^+$ drain region 6. Numeral 9 denotes a conductor, which is to silicide-react with the semiconductor layer 8 to form a silicide region. Numeral 10 is a line for connection of conductor 9, which corresponds to the bit line 1, 2 in the example of FIG. 1.

In the present invention, a memory element AF in a selected cell is made to conduct by applying a voltage of over a certain threshold value between the $n^+$ drain region 6 and the conductor 9. An electric current flowing with conduction generates heat, which causes or promotes the silicide reaction between the semiconductor layer 8 and the conductor 9, thus forming an electrically stable conducting state.

Particularly, in the present invention, a material for semiconductor layer 8, a material for conductor 9, and/or a fabrication method is selected so that when a constant current supply (not shown) for supplying a constant current of 100 mA is connected to the bit line 1, 2 to break down the memory element AF, the silicide reaction proceeds at a reaction rate of 10 m/sec (ten meters per second).

The material used for the semiconductor layer 8 is preferably nondoped amorphous silicon or amorphous silicon doped with a trace amount of boron being a p-type dopant. Further, the amorphous silicon is preferably hydrogenated or halogenated silicon containing hydrogen or halogen atoms. Also, it is desirable that the amorphous silicon be silicon formed by a method for excluding oxygen because of contamination etc.

The material used for the conductor 9 of the present invention is a metal well silicide-reacting with the amorphous silicon among those generally called high-melting point metals. Specifically, the metals includes tungsten (W), titanium (Ti), tantalum (Ta), molybdenum (Mo), cobalt (Co), hafnium (Hf), nickel (Ni), zirconium (Zr), chromium (Cr), vanadium (V), palladium (Pd), or platinum (Pt), alone or an alloy of materials selected from these, or a compound containing either one of these materials as a main component.

The example of FIG. 2 shows the structure in which the conductor 9 is formed only on the top surface of semiconductor layer 8, but the conductor is preferably provided also on the bottom surface of semiconductor layer 8. The upper and lower conductors of the material as described above cause the silicide reaction to proceed upwards and downwards, which further increases the writing speed and further decreases the conduction resistance. In addition, because the silicide reaction can take place independently of the polarity of applied voltage, degrees of freedom are increased for designing the drive circuit.

If the direction of the electric current to cause the reaction between metal and semiconductor is determined is that electrons flow from the metal layer toward the amorphous semiconductor layer, the flow of electrons facilitates movement of metal atoms into the amorphous semiconductor, thereby effectively lowering the resistance of the amorphous semiconductor region.

In particular, if either W or Ti is selected as the metal, the amorphous silicon layer can be formed much easier selectively on W or Ti even at a low temperature at which the reaction does not take place between the metal and the amorphous silicon. Thus, the antifuse can be continuously film-formed in self alignment, presenting an advantage that the antifuse with a highly clean interface can be fabricated with a decreased number of masks.

The thickness of the amorphous semiconductor region is determined in accordance with the specification of the breakdown voltage etc., which is preferably between 50 nm and 200 nm in respect to their relation with peripheral circuits. Also, the thickness of the metal needs to be set to a sufficient film thickness for the reaction for forming a compound with the semiconductor. If the metal is W and if the semiconductor is amorphous silicon, because amorphous silicon about 3.6 times thicker than the film thickness of metal reacts therewith to form $WSi_2$, a necessary film thickness of W is at least about 0.3 times the film thickness of amorphous silicon. If the metal is Ti and if the semiconductor is amorphous silicon, because amorphous silicon about 3.2 times thicker than the film thickness of metal reacts therewith to form $TiSi_2$, a necessary film thickness of Ti is at least about 0.3 times the film thickness of amorphous silicon also in this case.

Further, a function as a memory cell is realized by adding a structure with a rectifying effect in series to the amorphous semiconductor region. Since this memory cell is simple in structure and can be disposed in a gap between wires, a superhigh density ROM can be realized thereby.

Since the semiconductor device of the present invention can be fabricated in perfect self alignment, fabrication steps are simplified and high-record-density ROMs can be readily fabricated.

The circuit of FIG. 1 showed the three-terminal cells using the transistor as a switching device, but the present invention may also be applied to two-terminal cells, including a structure using only a memory element AF at an intersecting point between a word line and a bit line and a structure of lamination of a memory element and a diode as a rectifying element at an intersection.

Specific examples of the method for producing the semiconductor layer in the present invention are the plasma CVD process by glow discharge using a raw gas of silane, and the sputtering method under an atmosphere containing hydrogen gas.

The gas used in the plasma CVD process may be a gas containing, for example, $SiH_4$, $Si_2H_6$, $SiF_4$, $SiCl_4$, $SiHCl_3$, or $SiH_2Cl_2$ singly or in combination of two or more thereof, and a gas such as $H_2$, Ar, or $B_2H_6$ may be used as needed.

In the case of the sputtering method, high-purity single crystal silicon is used as a raw material target and sputtering is conducted under a $H_2$ or Ar atmosphere. More preferably, the bias sputtering method is employed for controlling movement of sputtered atoms with application of a bias energy. Film-forming conditions in these methods will be detailed in the description of the embodiments.

Specific examples of the method for producing the conductor are the vapor deposition method, the ion plating method, the sputtering method, and the CVD method, among which the bias sputtering method as described above is preferably used, as in the production process of the amorphous silicon semiconductor.

Particularly, if the film formation of conductor and semiconductor is carried out in a same chamber or in a multiple chamber system through which the substrate can be transferred without being exposed to an oxygen atmosphere such as air, the interface between the conductor and the semiconductor will have excellent characteristics and then the silicide reaction as described above can take place with good reproducibility.

Then the silicide region, which is formed by the reaction between the semiconductor and the metal, with unwillingly introduced impurities thus being substantially reduced, and which is formed in a cell by breakdown with a relatively low voltage, has a conical shape as can be expressed as a pyramid shape, a cone shape, a rectangular cone, or a circular cone. It was found that this shape is mechanically and electrically very stable as compared with other shapes.

A cell decreased in resistance (or short-circuited) between a pair of conductors by the conical silicide region, is stable, fast in reading speed, and high in reliability.

Figure 29A:
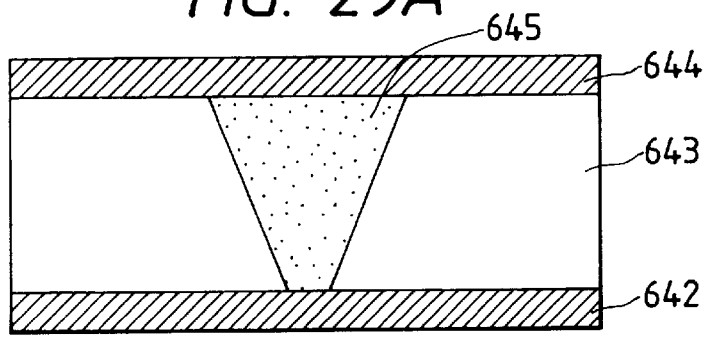
FIGS. 29A and 29B are diagrammatic cross sections to show shapes of silicide region.
Figure 29B:
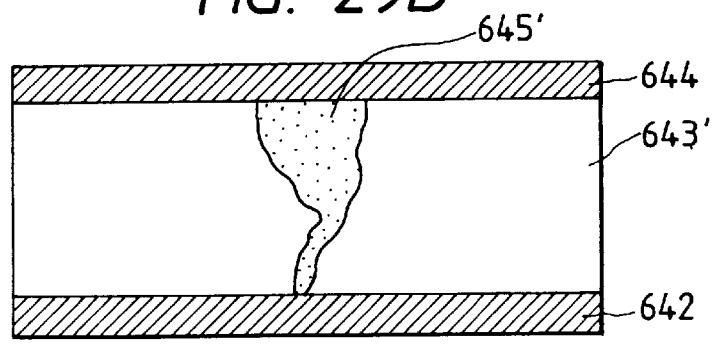

Incidentally, FIGS. 29A and 29B are cross sections to show the shape of the silicide region in the cell according to the present invention and the shape of the silicide region in a conventional cell, respectively. In the drawings, numerals 642 and 644 each denotes a conductor of metal (Ta), 643, 643' an amorphous silicon layer, and 645, 645' a tantalum silicide layer.

The silicide layer of FIG. 29B is inferior in reproducibility because the position and shape of crystal grains are unstable because of migration. In contrast, the silicide layer of the present invention in FIG. 29A is stable and high in reliability.

Figure 3:
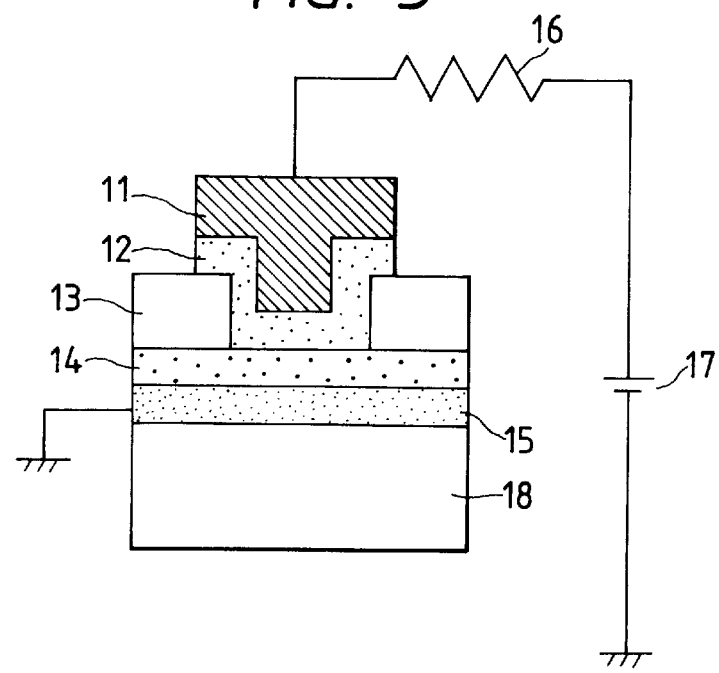
FIG. 3 is a diagrammatic cross section to show a cell for measurement of electric characteristics.

Next described are electrical characteristics of the cell of the present invention. FIG. 3 shows a sample of the cell according to the present invention, which was produced for measuring electrical characteristics. The sample has such a structure that tungsten 15 and nondoped amorphous silicon 14 are built up on a silicon substrate 18 and that tungsten 12 and wire 11 are built up in a contact hole provided in an insulating film 13. Numeral 17 designates a dc power supply, and 16 a resistor.

Figure 4:
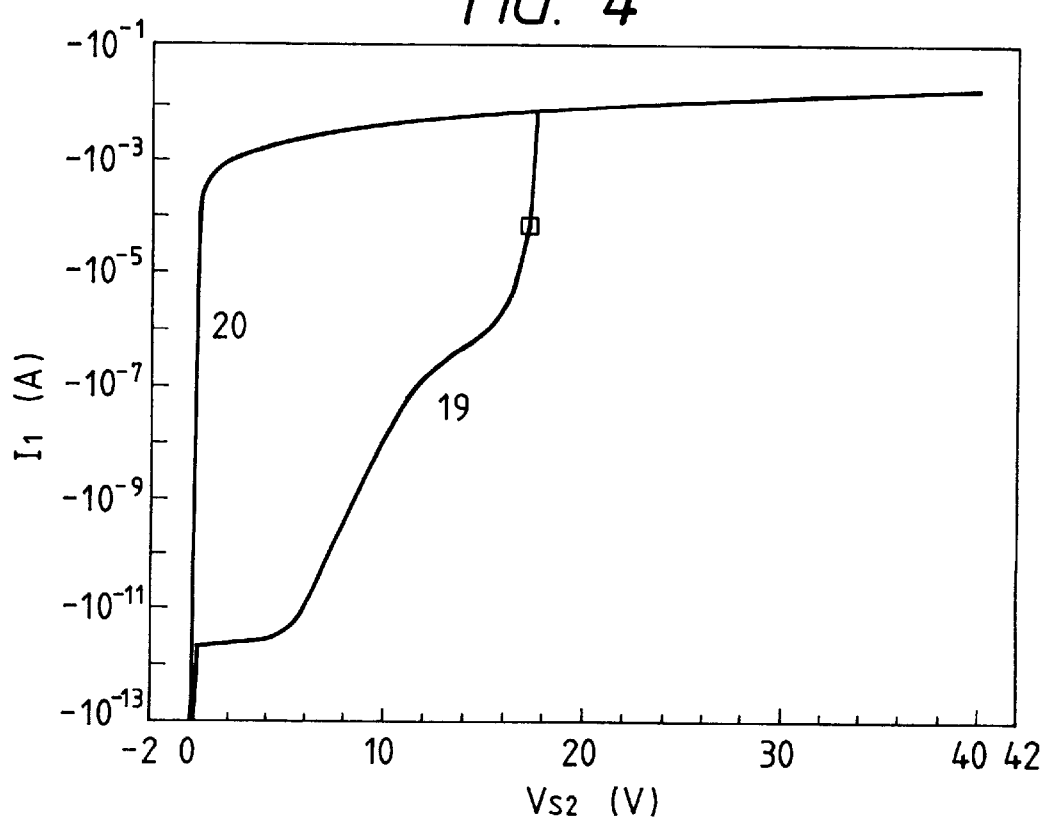
FIG. 4 is a graph to show voltage-current characteristics upon writing.

FIG. 4 shows results of experiments when writing was made. In FIG. 4, the horizontal axis represents the voltage applied between the electrode 11 and the substrate while the vertical axis the electric current flowing in the electrode 11 with application of voltage. A characteristic 19 indicates that high-resistance silicon is broken down with application of a voltage of 17 V. It is seen that the current after breakdown is limited to the upper limit by the protective resistor 16 of 1 kΩ and changes along a characteristic represented by current=voltage/1 kΩ.

A characteristic 20 represents a result when the electric current was again measured with application of voltage after the measurement of characteristic 19. The current changes along the characteristic expressed by current=voltage/1 kΩ from the beginning. This means that the high-resistance silicon layer is already changed into a low-resistance layer. The resistance, which was over some GΩ before writing, became very small, about 50Ω. From the above results, a sufficient writing voltage is for example 20 V in this case.

Figure 5A:
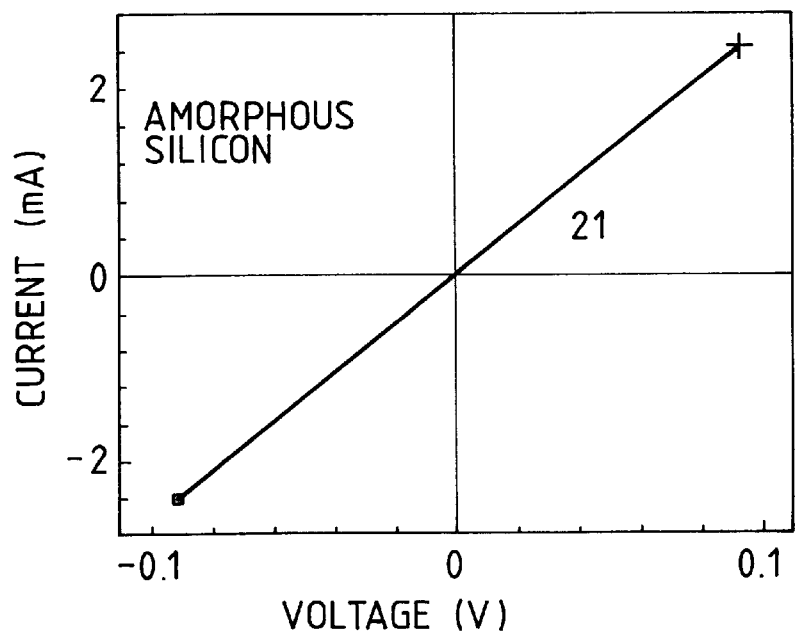
FIGS. 5A and 5B are graphs to show resistances after writing using amorphous silicon and polysilicon.
Figure 5B:
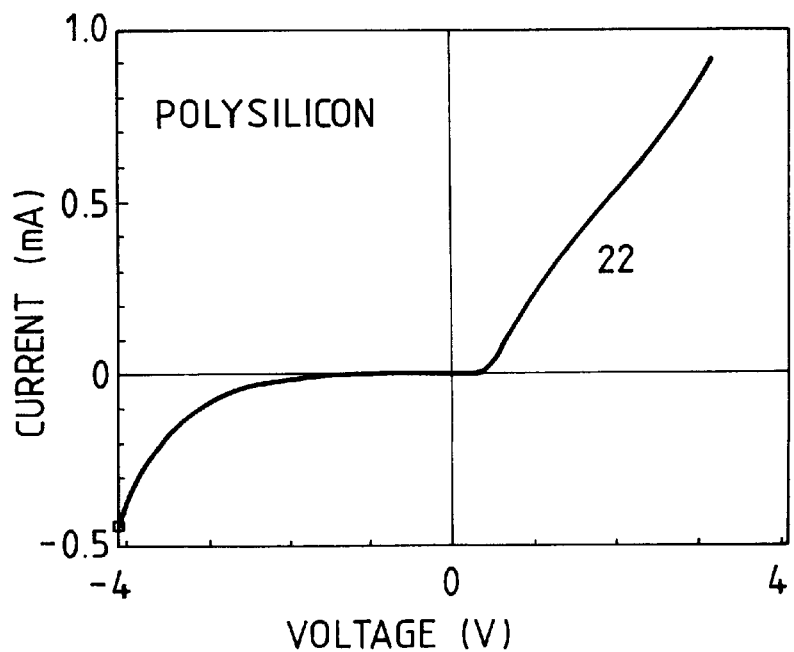

It is next shown that amorphous silicon is suitable for fabrication of an antifuse. FIGS. 5A and 5B show results of measurements when a resistance of antifuse after writing was measured for a case of amorphous silicon and a case of polysilicon. The experimental method was the same as described above, and a sample with a film of polysilicon instead of amorphous silicon was also produced for comparison of characteristics between them. Film-forming conditions of polysilicon were as follows: a flow rate of $SiH_4$ was 1 sccm, a flow rate of Ar was 320 sccm, and the power of 180 MHz and 150 W was applied to the plasma-exciting electrodes to excite plasma of 10 mTorr. The substrate was kept floating and the temperature was 300° C. Ion energy for irradiating the substrate on this occasion was 25 e V and the film-forming speed was 1 nm/min. The film formation was continued for 100 minutes.

Characteristics 21 and 22 indicate voltage-current characteristics after breakdown for the cases of amorphous silicon and polysilicon, respectively. The example using amorphous silicon exhibits a characteristic of ideal linear resistance, and shows a low resistance of 50Ω. In contrast, the characteristic 22 of the example using polysilicon is nonlinear and the resistance is large over 1 kΩ.

Figure 6:
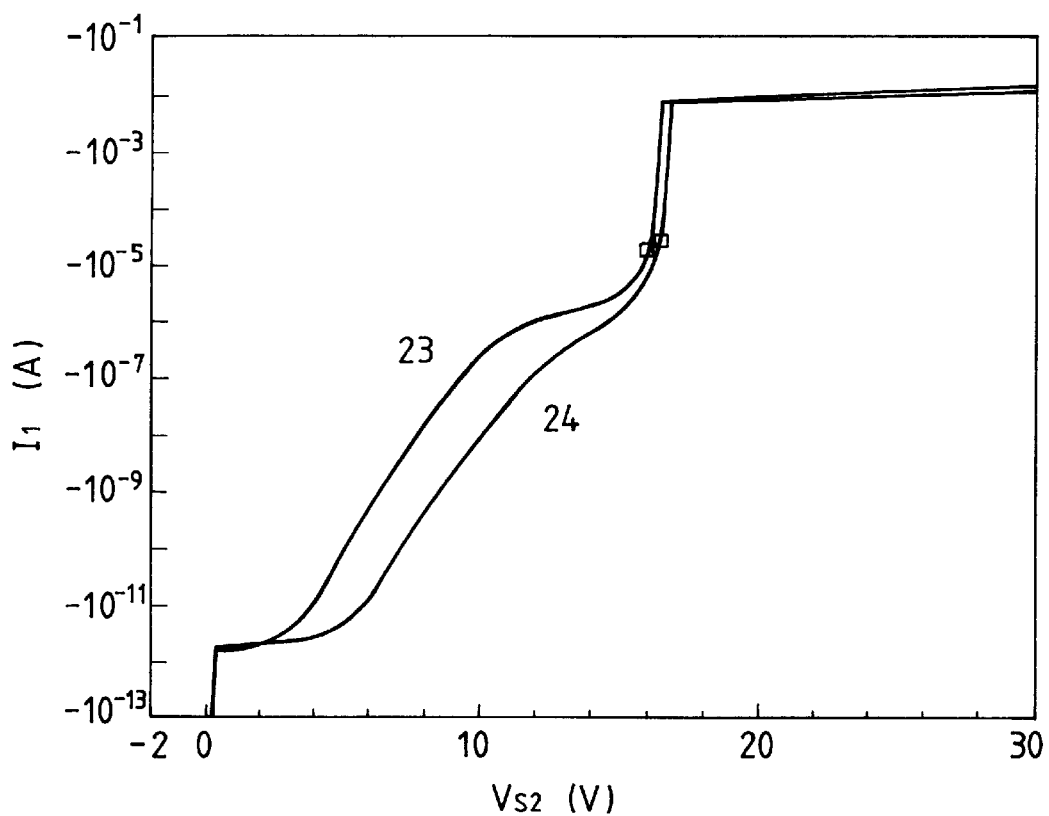
FIG. 6 is a graph to show current-voltage characteristics upon writing for amorphous silicon and polysilicon.

Further, FIG. 6 shows current-voltage characteristics upon breakdown of amorphous silicon and polysilicon. Characteristics 24 and 23 are current-voltage characteristics upon writing of examples using amorphous silicon and polysilicon, respectively. It is seen that the characteristic 24 with amorphous silicon indicates a smaller tunnel current upon writing than the characteristic 23 with polysilicon.

In a large-scale circuit, there remain a lot of antifuses not written, so that the total amount of leakage currents in the entire circuit will be large. This will result in increasing power consumption, which makes applications to large-scale circuits difficult. Taking this into consideration, it is understood that the antifuse had better be constructed of amorphous silicon.

Figure 7:
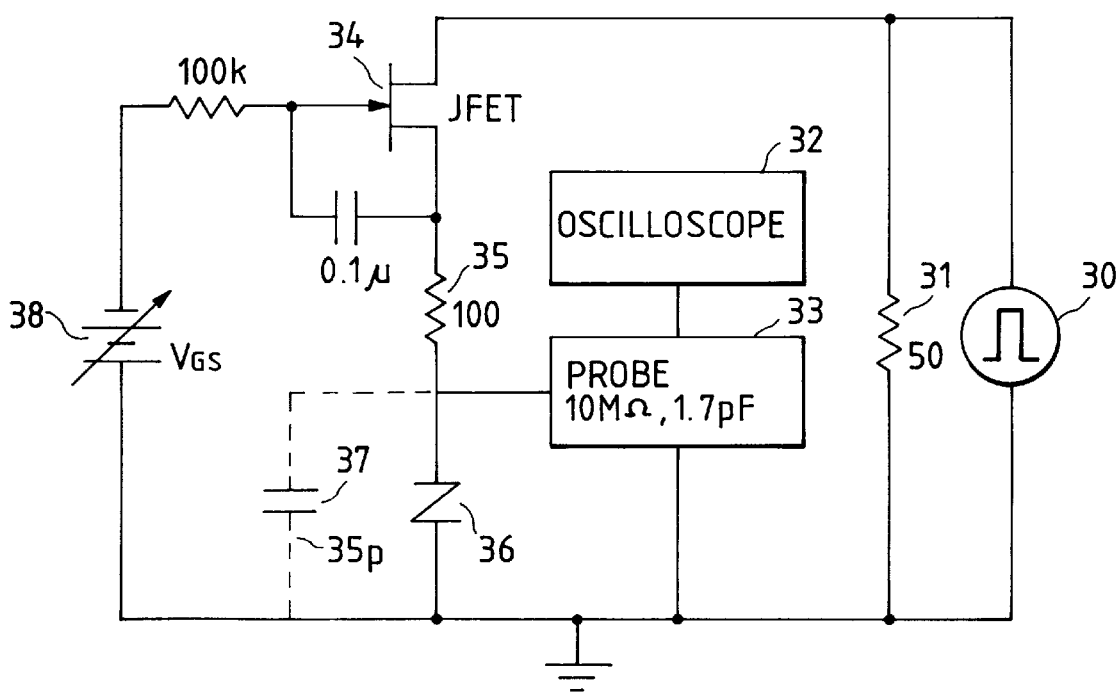
FIG. 7 is a circuit diagram to show a circuit for measuring a breakdown phenomenon.

FIG. 7 shows a circuit for experiment of breakdown caused with a pulse. Numeral 36 designates an antifuse, which was of intrinsic amorphous silicon and had a film thickness of 50 nm in this measurement. Numeral 34 denotes JFET, which works as a constant current supply determined by a voltage value of voltage supply 38 in this case. In this experiment, JFET works as a current supply of 7 mA when the voltage of voltage supply 38 is 0 V. Numeral 30 denotes a pulse generator, and resistors 31, 35 are for matching in order to control reflected waves upon high-frequency measurement. A parasitic capacitance 37 of 35 pF is given in parallel to the antifuse 36. Numeral 32 denotes an oscilloscope, which measures a voltage between the both ends of the antifuse through a high-frequency probe 33 of an input capacitance 1.7 pF and an input impedance 10 MΩ.

Figure 8:
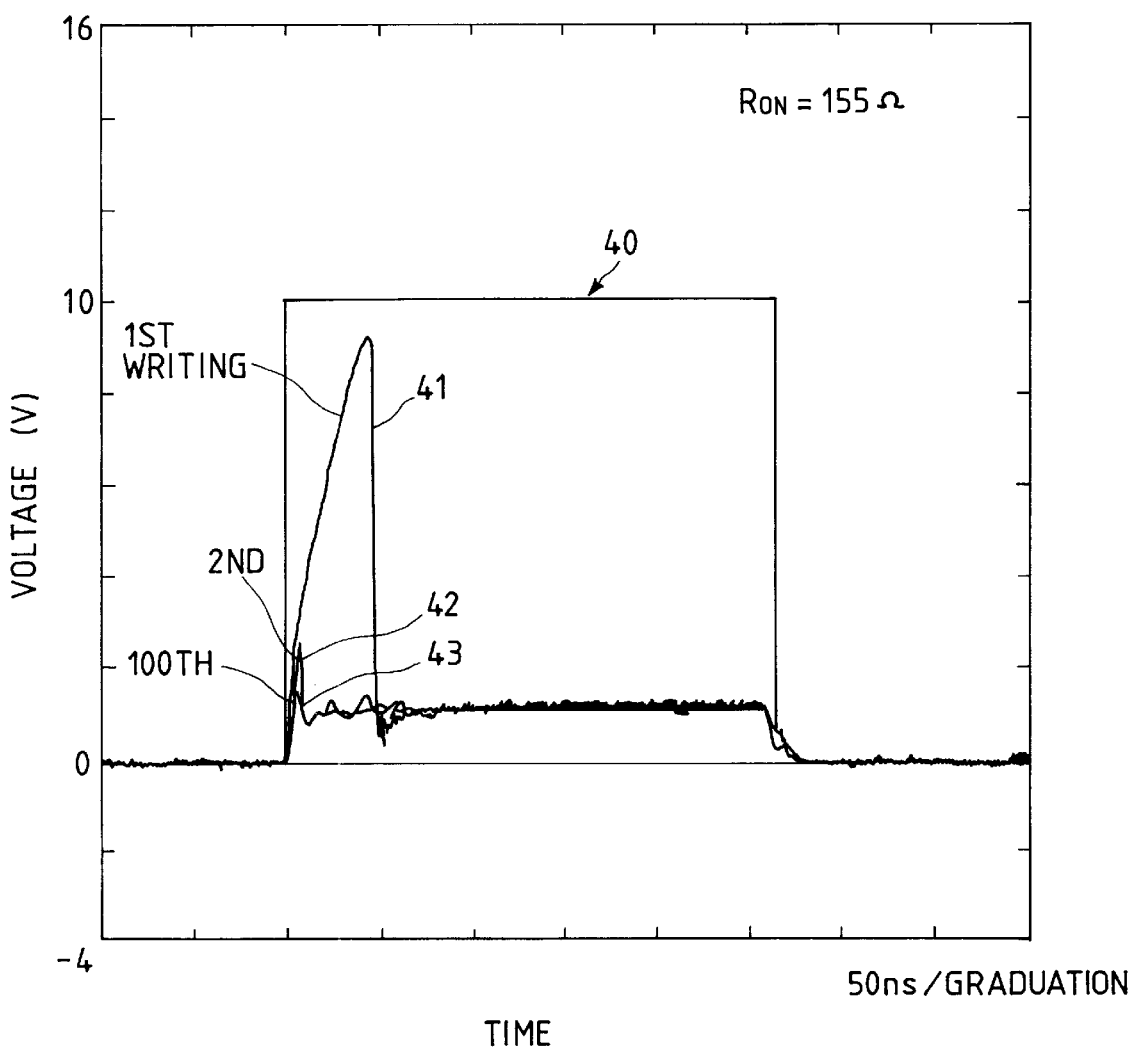
FIG. 8 is a graph to show a voltage change upon breakdown.

FIG. 8 shows the measurement results. Numeral 40 shows a waveform of an input pulse, which was a pulse of 10 V and 250 nsec. Numeral 41 denotes a voltage applied to the antifuse when a pulse is input first time, and it is seen that breakdown occurs at about 9 V. It is clear that the voltage applied to the antifuse immediately after breakdown is 1.16 V and from this value, the resistance of antifuse at this point is 155Ω. Numeral 42 represents a change of voltage applied to the antifuse when a second pulse is input. From this it is understood that the antifuse short-circuits with 155Ω from the beginning. Numeral 43 indicates a change of voltage applied to the antifuse when a 100th pulse is input, and this also shows that the antifuse short-circuits with 155Ω from the beginning. The above results verified that the antifuse became stably conducting by first writing.

Figure 9:
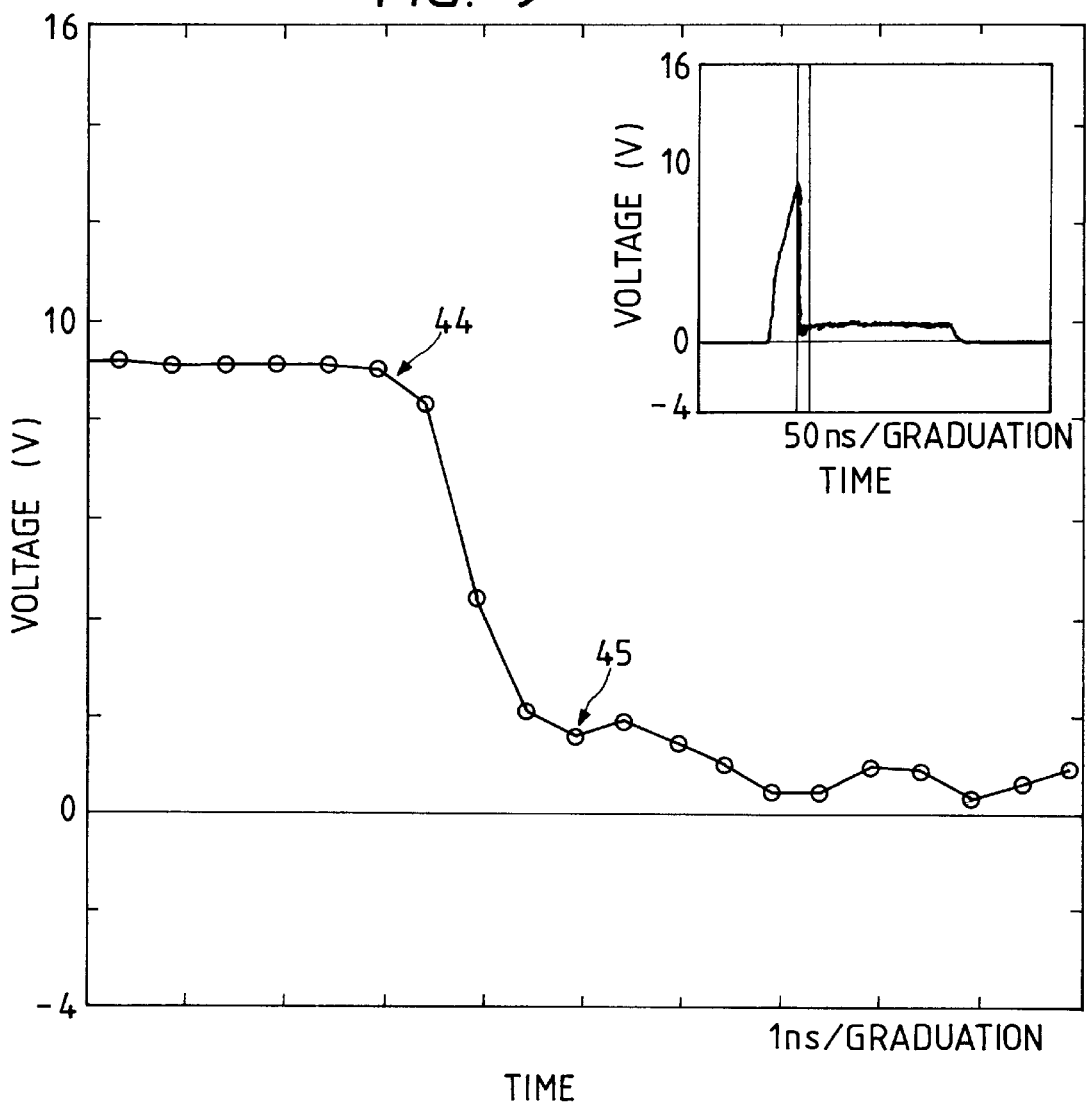
FIG. 9 is a graph obtained by partly enlarging FIG. 8.

FIG. 9 is an enlarged drawing to show a voltage change at the moment when the breakdown occurs upon input of the first pulse. It is seen that the breakdown starts at 44. After that, the voltage decreases and then becomes nearly constant at 45. This verifies that the antifuse becomes conducting within a time of about 1 nsec once the breakdown starts. This is a speed more than two orders faster than writing speeds of a conventional antifuse, which results from the fact that a highly clean interface was achieved. It is understood that in this writing the silicide reaction takes place at a silicide reaction rate of not less than 10 m/sec.

In FIG. 8 a time from input of pulse to end of writing is about 50 nsec, most of which is a time for charging the parasitic capacitance of 35 pF by the current source of 7 mA. Thus, an actual writing time is about 1 nsec as described previously. Accordingly, the total writing time can be further decreased by further enhancing current drive performance of JFET. If the parasitic capacitance is set smaller by fine patterning, the charge time becomes shorter to decrease the writing time.

JFET was used herein, but it may be replaced by a normal CMOS inverter and a gate voltage thereof may be driven by a pulse generator. In this case a voltage is supplied from the power supply through a PMOS transistor to the antifuse, thereby inducing the breakdown. It is also easy to operate the PMOS as the power supply of 7 mA used in this experiment. The current drive performance may easily be enhanced by designing of device.

Embodiments

The present invention will be described in more detail with the embodiments, but it should be noted herein that the present invention is by no means intended to be limited to these embodiments.

(Embodiment 1)

Embodiment 1 of the present invention is a device in the structure shown in FIG. 1 and FIG. 2, wherein the silicide reaction proceeds at the reaction rate of not less than 10 m/sec whereby a silicide region for conducting the upper and lower conductors is produced in a selected cell. Binary memory is realized by regarding a cell with the silicide region formed therein as "1" and a cell without the silicide region as "0".

The semiconductor device of the present embodiment was formed in the following manner. A silicon substrate having a p-type layer was prepared. An $n^+$ drain region 6 was formed therein by well-known nMOS process, and a $SiO_2$ film 7 was formed by CVD. After that, a contact hole was made in a nearly square shape of 1 μm each side. Next, a layer of nondoped, hydrogenated amorphous silicon 8 was formed in 100 nm by plasma CVD. The conditions were as follows.

Used gases (flow rate): $SiH_4$ (3 sccm), Ar (320 sccm)
Supplied power: 180 MHz, 150 W
Pressure: 10 mTorr
Temperature of substrate: 300° C.

Next, the substrate was transferred, without being exposed to the external air, from a CVD chamber through a carry chamber with an inert atmosphere to another CVD chamber. In this chamber a tungsten film 9 was formed in a thickness of 0.5 μm under the following conditions.

Used gases: $H_2/Ar/WF_6/SiH_4$
(flow rate ratio) (100:100:10:4)
Pressure: 120 mTorr
Temperature of substrate: 210° C.
Film-forming rate: 1.2 μm/min Next, the substrate was taken out of the multi-chamber system, and the amorphous silicon film and tungsten film were patterned in the shape of FIG. 2 by photolithography. After that, Al for wiring 10 was film-formed by RF-DC combination sputtering and then patterned. The film-forming conditions of Al were as follows.

Used gas (flow rate): Ar (82 sccm)
Supplied power: 80 W
Pressure: 3 mTorr
Target bias: −200 V
Substrate bias: −20 V
Temperature of substrate: room temperature A passivation film was finally given to complete a sample. Resistance of the cell was measured before writing of information. With application of voltage 6 V to the amorphous silicon layer, the resistance was 2 to 3 GΩ. Then a voltage 17 V was applied while keeping the tungsten side in a positive potential, so that the cell was broken down by the silicide reaction whereby an on-resistance of the cell including the MOS transistor became 1 kΩ (wherein the memory element of the amorphous silicon layer had a resistance of about 50Ω).

Next, another sample was produced in nearly the same structure as the above sample except that the thickness of amorphous silicon (a-Si) was changed to 500 Å. With this sample, writing was able to be made under conditions of writing voltage 9 V, writing time 50 nsec, and writing current 7 mA. A resistance of a-Si after writing was 155Ω. A further sample was produced by forming the a-Si film by the bias sputtering method. The sputtering conditions were as follows.

Used gases (flow rate): $Ar/H_2$ (200 sccm/20 sccm)
Pressure: 10 mTorr
Temperature of substrate: 150° C.
Film-forming rate: 250 Å/min
Supplied power: 100 MHz/100 W
Target bias: −180 V
Substrate bias: 10 V This sample also showed similar characteristics to the above-described samples. According to the present embodiment as described above, the cell can be surely decreased in resistance by a single writing pulse and the pulse may be of a voltage lower than the conventionally necessitated voltages. The silicide reaction rate was not less than 10 m/sec when measured by the previously described method.

Incidentally, as a comparative example, a sample was produced in such a manner that amorphous silicon was formed on the drain region 6. When the resulted structure was taken out of the film-forming chamber, it was subjected to patterning by photolithography, and thereafter the tungsten film was film-formed. This sample was broken down at a silicide reaction rate of 8 m/sec. There were variations in resistance between the broken-down cells, and many cells malfunctioned. Statistically comparing the samples as to variations of resistances of broken-down cells and numbers of cells erroneously broken down, the sample of the comparative example where the silicide reaction rate was less than 10 m/sec had variations and malfunctions more than twice those of the samples of the present embodiment where the silicide reaction rate was not less than 10 m/sec.

(Embodiment 2)

Figure 10:
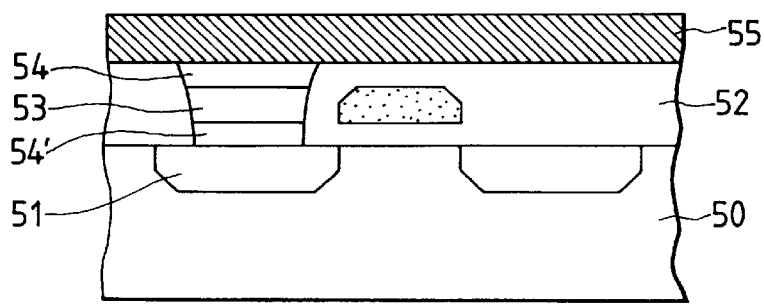
FIG. 10 is a diagrammatic cross section to show a cell in Embodiment 2.

FIG. 10 is a cross section to show the structure of a cell in a device according to Embodiment 2 of the present invention.

A feature of the present embodiment is that a sandwich structure of metal/amorphous silicon/metal is buried on a base conductor in a contact hole and the top surface thereof is flattened for wiring to be provided thereon. The present embodiment enables the memory element to be formed in a size smaller than the minimum processing dimensions, thus achieving high integration of cells and curtailing the number of masks used. Thus, a large quantity of devices can be supplied cheaply. A sample of the present embodiment was fabricated in the following manner.

Similarly as in Embodiment 1, a substrate 50 with an NMOS transistor formed therein was prepared, and a contact hole was made in a square of 0.5 μm each side. Then a tungsten (W) film 54' was selectively deposited only in the contact hole, using $WF_6$ gas etc. After that, an amorphous silicon film 53 was selectively formed at a substrate temperature of 200° C. by atmospheric pressure CVD process, using a gas containing 1% of $SiH_4$ in Ar. Again, W 54 was selectively deposited on the amorphous silicon film, whereby a memory element of amorphous silicon was formed in the sandwich structure in the contact hole. The above film formation was continuously carried out using the multi-chamber system without being exposed to the atmosphere. Next, wire 55 of Al—Si—Cu was formed and a passivation film was provided, thus completing the sample.

Since the present embodiment includes the two metal layers on either side of the amorphous silicon film, the direction of the writing voltage may be determined in either direction, and there are more degrees of freedom for designing the writing drive circuit.

Also, the writing speed was improved 10 to 40% more than those of the samples of Embodiment 1. The leakage current was also decreased 10 to 40% over those of the samples of Embodiment 1. The wiring capacitance was lowered 10 to 20% as well.

A sample was fabricated by changing the contact hole of the above sample into a tapered contact hole etched wide for an upper opening and narrow for a lower opening. This sample showed a further improved yield as against the above sample. The characteristics of the sample were in the same level.

(Embodiment 3)

Figure 11A:
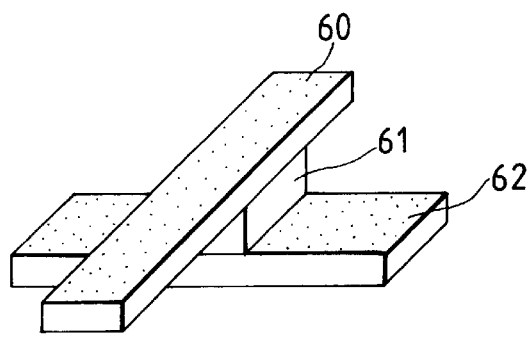
FIGS. 11A, 11B, and 11C are drawings to show a structure, circuit, and cross section of the semiconductor device in Embodiment 3.
Figure 11B:
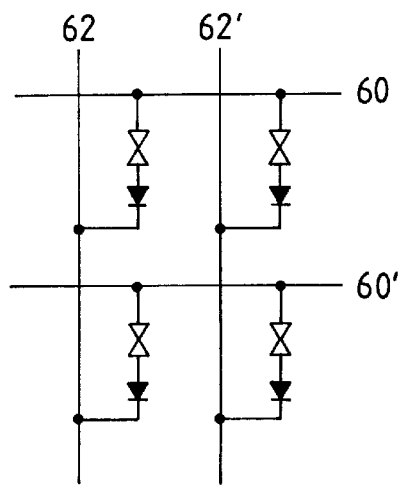
Figure 11C:
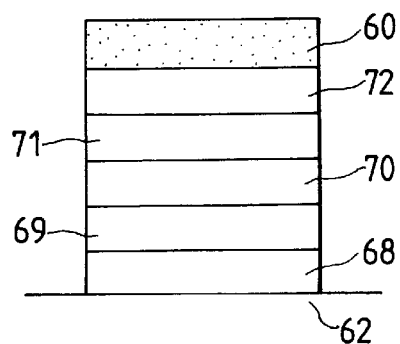

FIGS. 11A, 11B, and 11C show a device according to Embodiment 3 of the present invention.

The present embodiment concerns a two-terminal cell using a diode as a rectifying device, and realizes cost reduction by a decreased number of steps and high integration by steps only of film formation and patterning of wiring.

FIG. 11A shows the structure of a cell, FIG. 11B a circuit of the device, and FIG. 11C a cross section of the cell. Numerals 62, 62' designate wires to become bit lines, numeral 68 does a $p^+$ layer, 69 an $n^-$ layer, and 70 an $n^+$ layer, thus constituting a diode ($p^+n^-n^+$) herein. Numeral 71 denotes a metal layer for silicide-reacting with amorphous silicon, 72 an amorphous silicon layer, and 60, 60' upper wires to become word lines.

A sample of the present embodiment was fabricated in the following manner.

A conductor film for base wiring, consisting of a lamination of Al and Cr, was formed on a substrate having an insulating surface. On the conductor film, films of $p^+$-type polysilicon, $n^-$-type polysilicon, $n^+$-type polysilicon, Ti, and amorphous silicon were continuously formed in the multi-chamber system.

Next, layers from layer 62 to layer 72 were patterned by reactive ion etching in accordance with bit line patterns to become base wiring.

After that, etching was done to remove, out of the lamination patterns remaining in stripes, the layer 68 to layer 72 except for the layer 62 in accordance with the width of the upper wiring patterns, using $CF_4$ gas and $O_2$ gas, thereby forming island-shape laminates 61 (or 68 to 72).

After that, in order to form an interlayer insulating film, etch back was conducted using film formation of oxide film and a photoresist, thereby forming a nearly flattened interlayer insulating film.

Then the a-Si layer 72 was exposed, a natural oxide film was removed with dilute hydrofluoric acid under a nitrogen atmosphere, the resultant was washed with ultrapure water, the substrate was carried under a nitrogen atmosphere into a metal film-forming chamber, and Cu wiring was formed.

The present embodiment employed the lamination structure of Al and Cr as wiring for bit lines, but the wiring may, of course, be formed of another metal, alloy material, or semiconductor material of low resistance.

Figure 19:
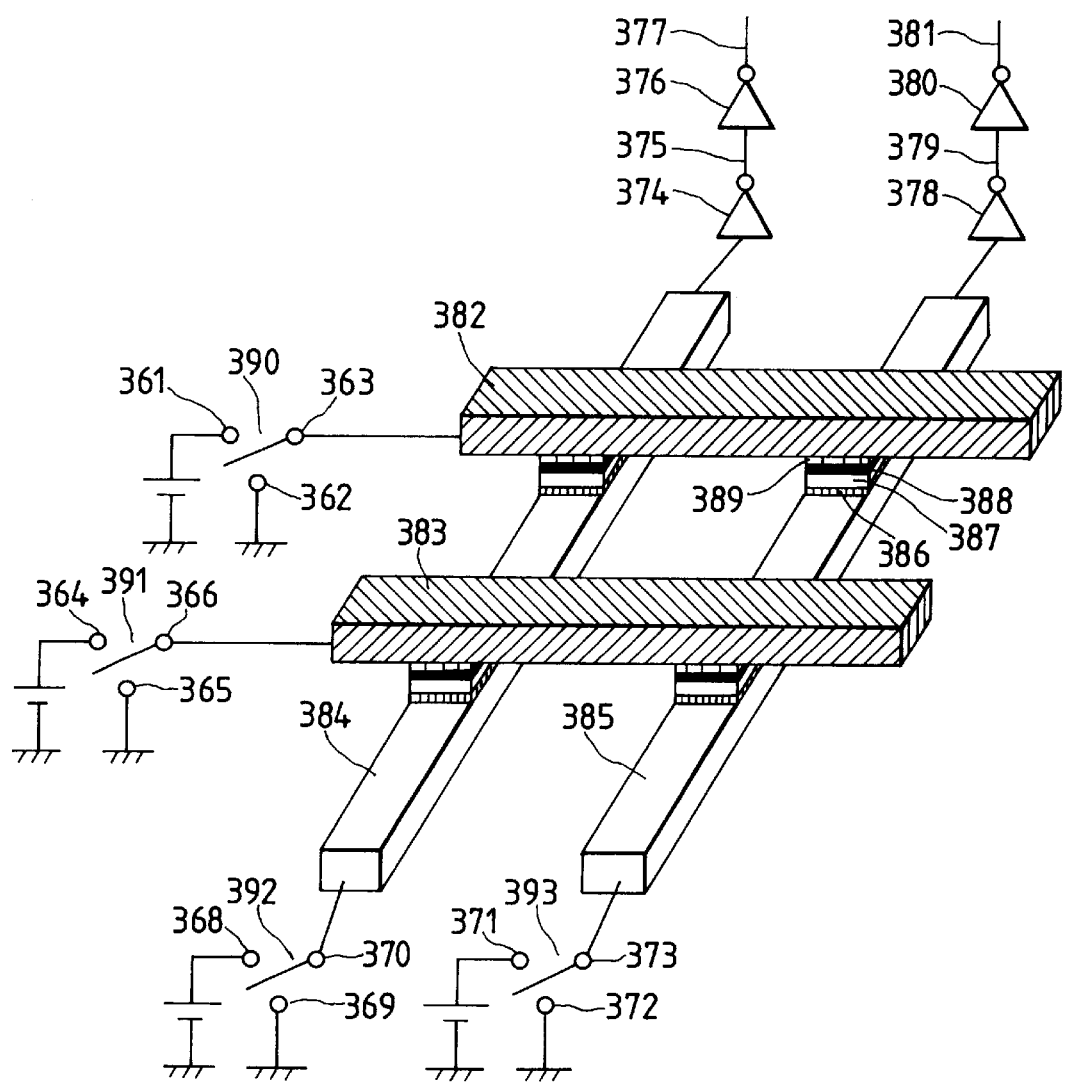
FIG. 19 is a diagrammatic drawing to show a ROM of Embodiment 13.

Next, the device shown in FIG. 19 was fabricated.

The structure of ROM of FIG. 19 can be formed in perfect self alignment in an IC process. For example, in FIG. 19, line 385, $n^+$ layer 386, p layer 387, amorphous semiconductor layer 388, and metal layer 389 are continuously formed and totally etched in longitudinal wiring patterns. Next, the peripheral portions are covered with an insulating film, for example, such as a silicon dioxide film to flatten the surface, and thereafter a layer of line 382 is formed. Then the layers are etched up to near the bottom lines 385, 384 in wiring patterns perpendicular to the previous wiring patterns. Finally, the resultant is again covered with an insulating film to form the ROM part of FIG. 19.

The vertical lamination of the present structure is easy on the IC process, and therefore, the integration can be further increased in the same chip area.

Figure 12A:
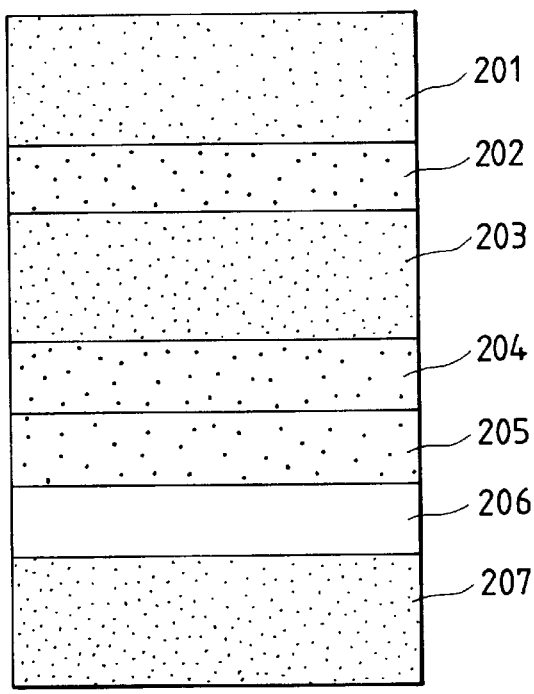
FIGS. 12A and 12B are diagrammatic drawings to show further examples of the structure of the semiconductor device according to the present invention.
Figure 12B:
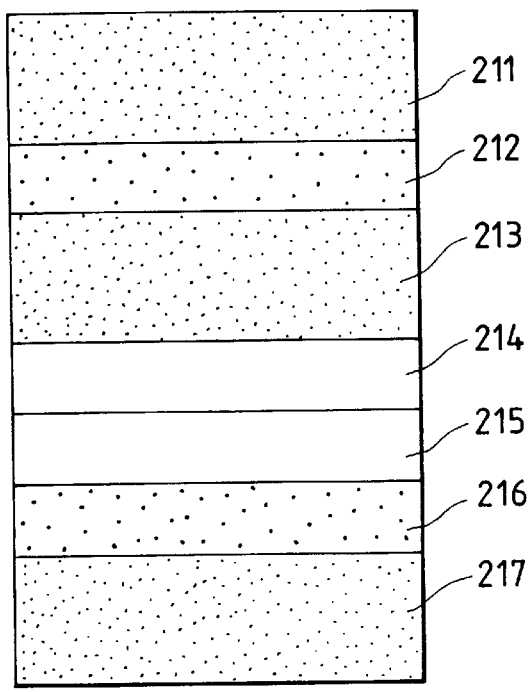

Modifications of the present embodiment are next described referring to FIGS. 12A and 12B.

In FIGS. 12A and 12B, numerals 201, 203, 207, 211, 213, and 217 each denote a metal layer, and 202, 212 a p-type amorphous silicon layer of an impurity density $10^{18}$ cm$^{-3}$ to become the antifuse.

Numeral 204 is p-type polysilicon of impurity density $10^{20}$ cm$^{-3}$, 205 p-type polysilicon of impurity density $3 \times 10^{17}$ cm$^{-3}$, and 206 n-type polysilicon of impurity density $10^{20}$ cm$^{-3}$. On the other hand, FIG. 12B shows another example in which the p-n structure to the antifuse is inverted from that of FIG. 12A, and in which numeral 214 is n-type polysilicon of impurity density $10^{20}$ cm$^{-3}$, 215 n-type polysilicon of $3 \times 10^{17}$ cm$^{-3}$, and 216 p-type polysilicon of $10^{20}$ cm$^{-3}$.

When the antifuse is produced in series to the diode in this manner, the pn diode part needs to be formed of a semiconductor layer close to a single crystal or polysilicon in order to reduce the leakage current. For continuously forming the all layers, polysilicon and amorphous silicon need to be separately formed in a same system. In FIG. 12A or 12B, the amorphous semiconductor 202, 212 is formed on the polycrystalline semiconductor constituting the diode. The amorphous semiconductor can be formed by low temperature CVD or sputtering. For example, for plasma CVD, the film-forming conditions may be determined as follows: $SiH_4$ is 3 sccm, Ar is 320 sccm, a power of 180 MHz and 150 W is applied to the electrodes for exciting plasma to excite plasma of 10 mTorr, the substrate is floating, and the temperature is set at 300° C. When the film formation is done on the substrate by sputtering with a p-type target of impurity density $10^{20}$ cm$^{-3}$ at the same time, a film of amorphous silicon is formed as doped in the p type and in an arbitrary concentration between $10^{16}$ and $10^{10}$ cm$^{-3}$ depending upon the target bias at that time.

The film-forming conditions of polysilicon may be as follows: SiH$_4$ is 1 sccm, Ar is 320 sccm, a power of 180 MHz and 150 W is applied to the electrodes for exciting plasma to excite plasma in a pressure of 10 mTorr, the substrate is floating, and the temperature is 300° C. For doping in the p-type or n-type, the film formation may be simultaneously done on the substrate in the same manner by sputtering with a p-type or n-type target of impurity density $10^{20}$ cm$^{-3}$, whereby a film of polysilicon is formed as doped in an arbitrary concentration between $10^{16}$ and $10^{20}$ cm$^{-3}$ depending upon the target bias at that time.

The thus formed layers may be etched in self alignment by RIE as described previously.

(Embodiment 4)

In the present embodiment, a semiconductor device was fabricated with a diode part of n$^+$pp$^+$ type by the procedures shown in FIGS. 13A to 13D.

This antifuse structure was achieved by forming a semiconductor device in self alignment by selective growth technology of metal on semiconductor and selective growth technology of semiconductor on metal.

Figure 13A:
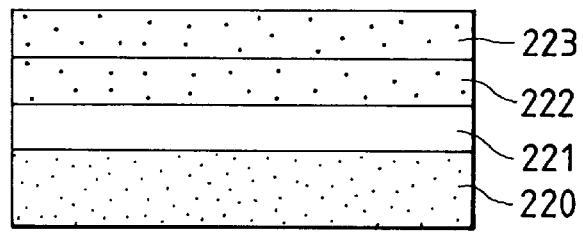
FIGS. 13A to 13D are diagrammatic drawings to show a process for fabricating the semiconductor device of Embodiment 4.
Figure 13B:
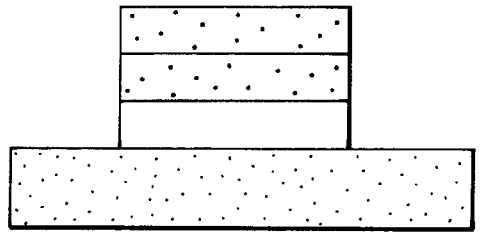

The forming steps in self alignment are shown in FIGS. 13A to 13D. A metal layer 220 is film-formed and etched in a desired pattern by RIE. The film-forming method is ordinary sputtering, whereby the film can be easily formed. After that, formed by plasma CVD process are films of n-type polysilicon 221 of impurity concentration $10^{20}$ cm$^{-3}$, p-type polysilicon 222 of impurity concentration $3\times10^{17}$ cm$^{-3}$, and p-type polysilicon 223 of impurity concentration $10^{20}$ cm$^{-3}$. The film-forming conditions of polysilicon may be determined as follows: SiH$_4$ is 1 sccm, Ar is 320 sccm, a power of 180 MHz and 150 W is applied to the electrodes for exciting plasma to excite plasma in a pressure of 10 mTorr, the substrate is floating, and the temperature is 300° C. For doping in the p type or n type, the film formation is simultaneously conducted on the substrate by sputtering with a p-type or n-type target of impurity density $10^{20}$ cm$^{-3}$ in the same manner, whereby a film of polysilicon is formed as doped in an arbitrary concentration between $10^{16}$ and $10^{20}$ cm$^{-3}$ depending upon the target bias at that time (FIG. 13A).

Figure 13C:
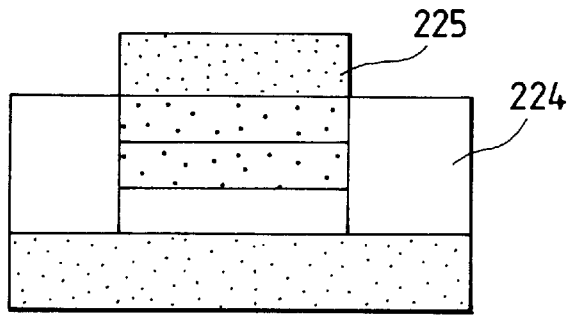
Figure 13D:
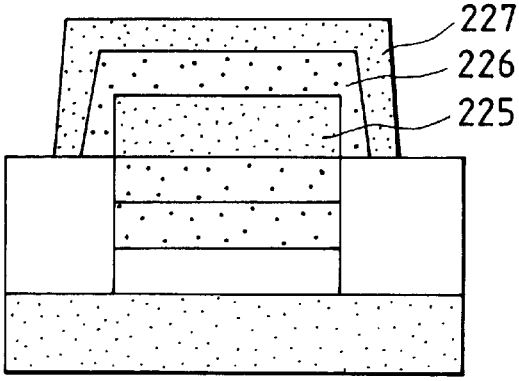

After that, the three layers of polysilicon 221, 222, 223 are etched by RIE (FIG. 13B); thereafter, an oxide film 224 is deposited; the surface is flattened before the semiconductor 223 is exposed; and a metal layer 225 is selectively grown only on the thus exposed semiconductor 223 (FIG. 13C). Further, a semiconductor layer 226 is formed only on the metal 225 by the selective growth technology of semiconductor on metal. Again using the selective growth technology of metal on semiconductor, a metal layer 227 is formed only on the semiconductor layer 226, obtaining the structure of FIG. 13D. The selective growth of metal 225, 227 on semiconductor can be effected employing the method as described in Embodiment 2.

(Embodiment 5)

A device of Embodiment 5 of the present invention is constructed of cells each having a rectifying device of a Schottky diode and a memory element of the antifuse type. FIGS. 14A–14C are diagrammatic drawings to illustrate the device of the present embodiment.

For the device of the present embodiment, the structure thereof will be described along fabrication steps. First, W, as a metal 231 to become a base conductor, was deposited on a silicon wafer having SiO$_2$, which was a substrate 230 having an insulating film surface (FIG. 14A).

After that, the W film was patterned, an insulating film 232 was formed, and then a contact hole was made. Then a p-type polysilicon layer 233 and a p$^+$-type polysilicon layer 234 were deposited in the same manner as in the previous embodiment.

The p layer 233 was polysilicon of film thickness 0.2 μm containing boron in a density of about $3\times10^{17}$ cm$^{-3}$, and the p$^+$ layer 234 was polysilicon of film thickness 0.1 μm containing boron in a density of about $1\times10^{20}$ cm$^{-3}$ (FIG. 14B).

Next, a W film 235 was selectively grown in 50 nm, and thereafter an a-Si film 236 and a W film 237 were continuously formed, thus producing a memory element (FIG. 14C).

The a-Si film 236 was p-type hydrogenated amorphous silicon containing boron in a density of about $1\times10^{18}$ cm$^{-3}$.

Since the semiconductor device of the present embodiment used the Schottky diode of a metal to be silicified and a semiconductor, it necessitated no changeover of dopant species and thus, formation of layers 233, 234 was easily done in the same chamber.

Also, the multi-chamber system was used for film formation of the memory element utilizing the selective growth, unwilling contamination such as oxygen was reduced on the interface, thus achieving the silicide reaction rate of not less than 10 m/sec. By this, the device of the present embodiment was able to be written at high speed and showed no malfunction.

Although FIGS. 14A to 14C show no upper wiring, it may be provided by patterning the W film 237 itself in a wiring pattern or forming another conductor layer.

(Embodiment 6)

Figure 15A:
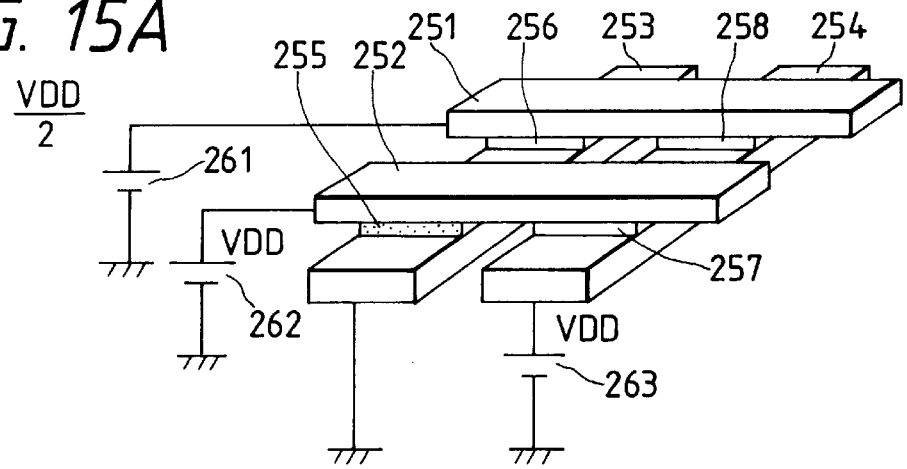
FIGS. 15A and 15B are a diagrammatic drawing and a circuit diagram to show the semiconductor device of Embodiment 6.
Figure 15B:
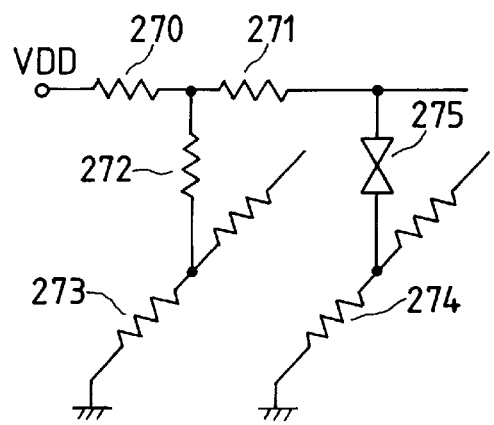

FIGS. 15A and 15B are drawings to show a device of Embodiment 6 of the present invention. This shows a technique for short-circuiting arbitrary lines among a lot of lines. There are amorphous semiconductors 255, 256, 257, 258 provided between metal lines 251, 252 and conductor lines 253, 254. The metal lines 251, 252 are for example of tungsten or tantalum, but may be of any other metal. The conductor lines 253, 254 may be of a metal or a semiconductor doped with an impurity in a high concentration.

For example, let us consider an example of making the antifuse 255 between the lines 252 and 253 electrically conducting. First, as shown in FIG. 15A, the metal line 251 is coupled to a voltage source 261, the metal line 252 to a voltage source 262, the conductor line 253 to the ground electrode, and 254 to a voltage source 263. In this case, the voltage source 261 outputs a smaller voltage than the voltage sources 262, 263 do. For example, supposing the output of voltage source 261 is VDD/2 and those of voltage sources 262, 263 are VDD, the voltage of VDD is applied to the amorphous semiconductor region 255, the voltage of VDD/2 to 256, 258, and no voltage to 257. If the thickness of the amorphous semiconductor layer and the impurity concentration thereof are selected so that a voltage for causing breakdown in the amorphous semiconductor is between VDD/2 and VDD, breakdown occurs only in the amorphous semiconductor 255. Accordingly, only the amorphous semiconductor 255 reacts with the metal line 252 to form a low-resistance silicide.

Changing the voltages applied to the metal lines and conductor lines in this method, an amorphous semiconductor region at an arbitrary place can be changed into a low-resistance silicide. This means that connection and insulation can be arbitrarily determined between arbitrary lines.

Grounding the line 254 can bring the antifuse 257 between the lines 252 and 254 into an electrically conducting state. If the antifuse 255 is already in a conducting state on this occasion, the current flows from the line 252 through the antifuse 255 to the line 253, which will possibly cause a voltage drop on the line 252 due to wiring resistance. FIG. 15B shows an equivalent circuit in this case.

Resistors 270, 271, 273, 274 are resistance components in the lines 252, 253, 254. A resistor 272 is an on-resistance of the antifuse 255 and numeral 275 designates the antifuse 257. For example, assuming that the lines 251, 252, 253, 254 are made of W, that the line width is 1 µm, and that the line height is 1 µm, and when the antifuses are arranged at intervals of 1 µm, a resistance per 1 µm of line length to an adjacent antifuse is, at most, about 0.055Ω.

In contrast, since an on-resistance 272 of antifuse is about several ten Ω, little voltage drop is caused in resistor 270 by a current flowing through the resistors 270, 272, 273. After all, the breakdown voltage is applied only to the antifuse 275, which is thus selectively brought into a conducting state.

In this example the voltage source 261 supplied VDD/2, but it may output any voltage smaller than VDD without a need to be limited to VDD/2. Further, the voltages applied to the lines were positive, which is because a low-resistance conducting state can be readily achieved by migration of metal atoms into semiconductor as is expected to occur when electrons flow from the metal side to the amorphous semiconductor at breakdown.

The voltage may be either positive or negative as long as materials for the lines sandwiching the amorphous semiconductor both are made of either one metal of W, Ta, Ti, and Mo.

The reaction between the metal and the amorphous semiconductor may be caused by letting an electric current flow through a selected amorphous semiconductor layer as shown in this example, or may be caused by supplying heat from outside using a laser or a heater. Also, the reaction may be caused by letting the electric current flow while supplying heat from outside. Using both, the reaction is facilitated to achieve a high-speed connection between lines.

The present embodiment was described as an example including two metal lines and two conductor lines, but the number of lines arranged is arbitrary. In this case, insulation and connection can also be arbitrarily determined similarly between a metal line and a conductor line at an arbitrary position.

Also, the present embodiment showed an example in which the lines were made of a metal, but a conceivable modification is such that all lines are made of a material other than metal and a metal layer in contact with the amorphous semiconductor layer is disposed between two lines.

The two-terminal cell of the present embodiment as described above can be produced at low cost because of its simple structure, and either one of the polarities can be selected for the applied voltage. In addition, there is no voltage drop on a word line, because the wiring resistance of word line is smaller than the on-resistance of memory element (a resistance value of memory element after breakdown).

Since connection or insulation of lines can be arbitrarily determined by the voltage applied to between two lines as described above, the way of connecting between devices in a semiconductor integrated circuit can be determined after the IC fabrication process. This can realize, for example, a so-called programmable logic array (PLA) in which a lot of AND circuits and OR circuits are arrayed and lines for connection between the circuits can be freely determined in accordance with an application purpose of each user. The following describes such an embodiment.

(Embodiment 7)

Figure 16:
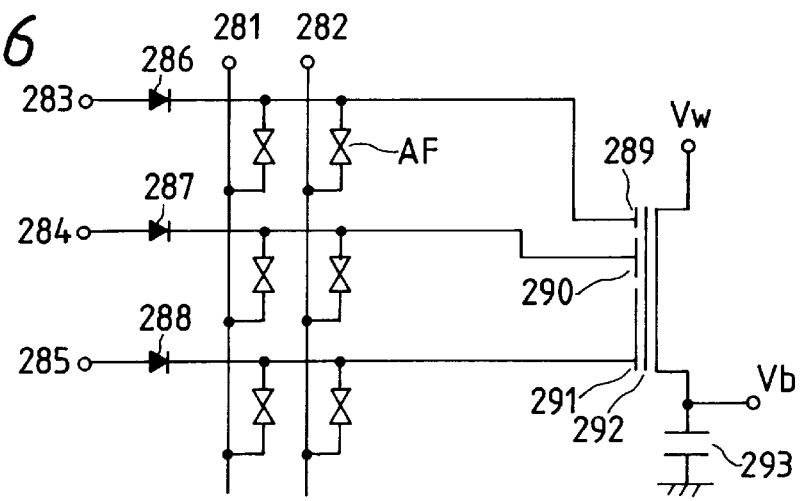
FIG. 16 is a circuit diagram to show the semiconductor device of Embodiment 7.
Figure 17A:
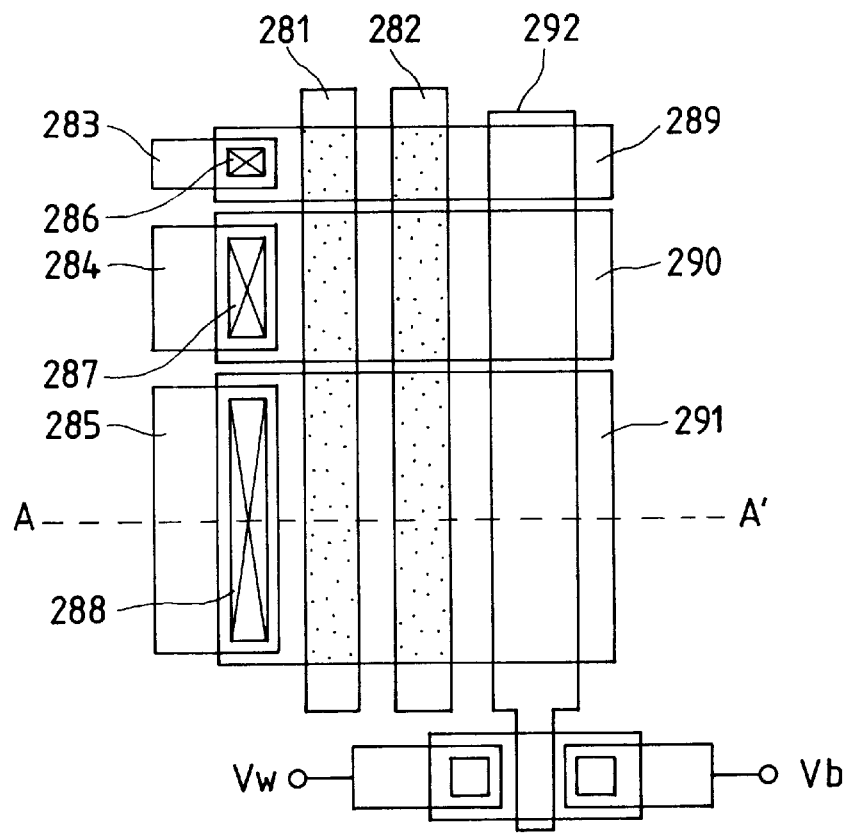
FIGS. 17A and 17B are a diagrammatic, plan view and a cross section to show the semiconductor device of Embodiment 7.
Figure 17B:
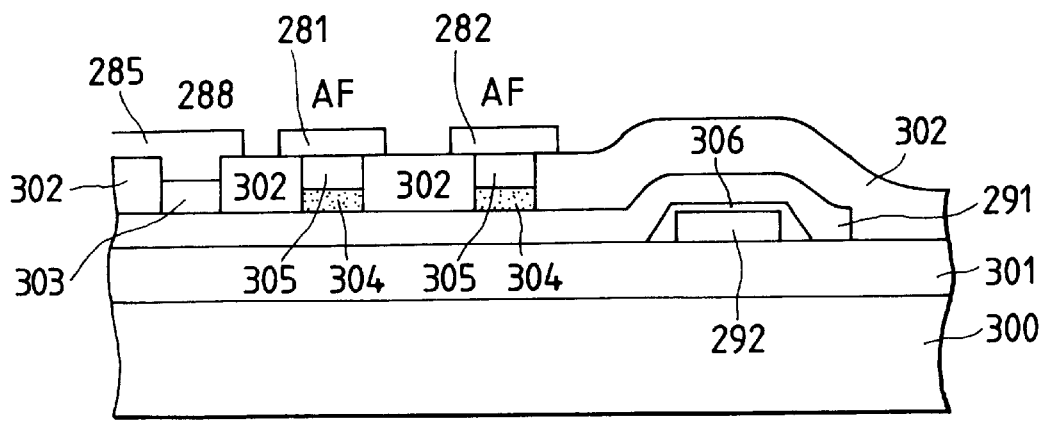

The seventh embodiment of the present invention is shown in FIG. 16, FIGS. 17A and 17B.

FIG. 16 shows a circuit layout, and FIGS. 17A and 17B are a plan view and a cross section near a memory element, respectively.

The present embodiment is an example in which the memory elements of the present invention are used at intersecting points in a control gate matrix for determining a signal applied to a control gate (289, 290, 291) of a neuron MOS transistor (VMOS). Bit lines 281, 282 in the control gate matrix are maintained at predetermined high potential and low potential upon operation of VMOS. Such MOS transistors are described in Japanese Laid-open Patent Application No. 3-6679 or IEEE TRANSACTIONS ON ELECTRON DEVICES, Vol. 39, No. 6, June 1992, PP1444–1455.

Accordingly, the memory element antifuse (AF) is used for programming a voltage applied to each control gate (289 to 291). Here, numerals 286 to 288 denote diodes.

The writing operation can be done in the same manner as in the previous embodiments, using the word lines 283–285 and bit lines.

Voltages applied to the control gates in accordance with breakdown of memory element control an electric current flowing between the source and the drain (between $V_w$ and $V_b$) of VMOS transistor by capacitive coupling with a floating gate (292).

Since a potential of the floating gate 292 is a linear sum of the voltages applied to the control gates, a single VMOS can deal with multiple values.

The structure of FIG. 17B is next described. Numeral 300 denotes a silicon substrate, 301 $SiO_2$, 291 a control gate of $n^+$-type polysilicon etc., 292 a floating gate of $n^+$-type polysilicon etc., 302 an interlayer insulating film, 304 a metal to be silicified, 305 hydrogenated amorphous silicon for silicide-reacting therewith, 282 an upper wire to become a bit line, 303 p-type polysilicon for forming a pn diode, and 285 a line for example of Al.

The present invention can considerably miniaturize the programmable logic array capable of handling multiple values by providing the control gate matrix of VMOS with the memory elements.

(Embodiment 8)

Embodiment 8 of the present invention is a modification of the semiconductor device shown in FIG. 1 and FIG. 2. The semiconductor layer 8 shown in FIG. 2 is ion-implanted, and the passivation film on the line 10 is a film formed at a low temperature of not more than about 250° C. As compared with the cases without ion implantation, the silicide reaction rate was improved by about 20%. This is effective to improve the writing speed and to decrease the writing voltage as well, thus being effective to enhance integration degree and to lower power dissipation.

The fabrication process of the device is next described.

A silicon substrate having a p-type layer was prepared, an $n^+$ drain region 6 was formed by well-known nMOS process, a SiO$_2$ film was formed by CVD, and thereafter a nearly square contact hole was made 1 μm square. Next, nondoped, hydrogenated amorphous silicon was formed in 50 nm by plasma CVD. The conditions were as follows.

Used gases (flow rate): SiH$_4$ (3 sccm), Ar (320 sccm)
Plasma conditions: 180 MHz, 150 W
Pressure: 10 mTorr
Temperature of substrate: 300° C.

Next, the substrate was transferred, without being exposed to the outside air, from a CVD chamber through a carry chamber of an inert atmosphere to another CVD chamber. In this chamber, a tungsten film was formed in a thickness of 50 nm under the following conditions.

Used gases: H$_2$/Ar/WF$_6$/SiH$_4$ (flow rate ratio 100:100:10:4)
Pressure: 120 mTorr
Temperature of substrate: 210° C.
Film-forming rate: 1.2 μm/min Next, the substrate was taken out of the multi-chamber system, and the amorphous silicon film and tungsten film were patterned in the shape of FIG. 2 by photolithography. In place of W, the metal may be Ta etc.

After the patterning, first ion implantation of boron was carried out through the above-described metal at an acceleration voltage of 25 keV and in a dose of 5×10$^{12}$ cm$^{-2}$. Subsequently, second ion implantation was carried out for Si, Ar, P, As ions each at an acceleration voltage of 50 to 110 keV, thereby implanting the ions into the above-described amorphous layer.

After that, Al for wiring was film-formed by RF-DC sputtering, and then patterning was done therefor. The film-forming conditions of Al were as follows.

Used gas: Ar (82 sccm)
Supplied power: 80 W
Pressure: 3 mTorr
Target bias: −200 V
Substrate bias: −20 V
Temperature of substrate: room temperature Finally, a SiN passivation film was film-formed at a temperature of not more than 250° C. Over 250° C., the silicide reaction would occur in part, and therefore, it was found that the passivation should be preferably formed at a temperature of not more than 250° C. The low-temperature film formation caused no deterioration in the ion-implanted layer, thus forming a stable semiconductor device.

In the above structure the semiconductor layer 8 does not always have to be an a-Si layer, but may be of polysilicon; since the above ion implantation formed ion-implant a-Si, equivalent characteristics were obtained.

(Embodiment 9)

Embodiment 9 of the present invention is obtained by modifying the devices in the structures shown in FIGS. 12A and 12B in such a manner that the a-Si layer as the first semiconductor region denoted by 202 or 212 is made as a nondoped layer and that the layer 205 or 215 as a part of the second semiconductor layer is replaced by a p-type a-Si layer or n-type a-Si layer, respectively. In this case, a film thickness of the nondoped a-Si layer 202, 212 was 50 nm, while the p-type a-Si layer of 205 was arranged to have a film thickness of 70 nm and a concentration of 5×10$^{17}$ cm$^{-3}$ or the n-type a-Si layer of 215 was arranged to have a film thickness of 60 nm and a concentration of 2×10$^{17}$ cm$^{-3}$. In the structures, a resistance between the metals 203, 207 in which a rectifier barrier is formed is lower than a resistance between the conductors or metals 201 and 203, and similarly, a resistance between the metals 213, 217 in which a rectifier barrier is formed is lower than a resistance between the metals 211 and 213. Thus, with application of a writing pulse to the metal 201 or metal 211, the a-Si layer denoted by 202, 212 is subject to the silicide reaction, but the lower a-Si layers of 204, 205, 206 or a-Si layers of 214, 215, 216 were free of the silicide reaction. Thus, the device was free of such a problem that the pn junction was broken. This can happen because the low resistance of the lower a-Si layers prevents the current from locally flowing, so as to lower the current density.

The present embodiment used the above-described film thicknesses, concentrations, etc., but the invention is not limited to those as long as the resistances of the second semiconductor regions 204, 205, 206 or the second semiconductor regions 214, 215, 216 are set lower than the resistance of the a-Si layer of the first semiconductor region 202 or 212. In the present constitution, the materials for the rectifier having a rectifier barrier were a-Si, which is the same material as 202, 212 and a material causing the silicide reaction, but the material may be polysilicon or single crystal silicon in this case as long as the resistance of the rectifier having the rectifier barrier is set smaller.

Although the present embodiment achieved the difference of resistances by the film thicknesses and concentrations, another means may be such that a pattern size of contact between the metal and the first semiconductor region, that is, a pattern of the upper layers 201, 202, is set smaller than a pattern of the lower layers 203 to 207 or similarly such that a pattern of the upper layers 211, 212 is set smaller than a pattern of the lower layers 213 to 217. By this arrangement, a high-integration memory was able to stably operate without trouble.

(Embodiment 10)

Embodiment 10 of the present invention is modifications of the semiconductor devices in the structures shown in FIGS. 12A and 12B, as obtained by replacing the a-Si layer 202, 212 of the first semiconductor region by a p-type ion implant layer and replacing the layer 205, 215 forming a part of the second semiconductor region by a nondoped a-Si layer. In this case, different from Embodiment 9, a resistance between the metals 203 and 207 as conductors, i.e., a resistance of the second semiconductor region is higher than a resistance between the metals 201 and 203 as conductors, i.e., a resistance of the first semiconductor region, or similarly, a resistance between the metals 213 and 217, i.e., a resistance of the second semiconductor region is higher than a resistance between the metals 211 and 213, i.e., a resistance of the first semiconductor region. After application of a writing pulse, the a-Si layer of 202, 212 underwent the silicide reaction, but the lower a-Si layers of the second semiconductor region, 204, 205, 206 or 214, 215, 216 did not undergo the silicide reaction. This is because the a-Si layer 202, 212 of the first semiconductor region is an ion implant layer, which is prone to silicide-react. It was thus verified that such an arrangement was possible that the rectifier side having the rectifier barrier was higher in resistance than the a-Si layer of the upper, first semiconductor region 202, 212.

The rectifier in the present structures was of the pin type, but it may be a Schottky rectifier without a need to be limited to it. The structures of the present devices realized stable operation, thus being suitable for high-integration memories.

(Embodiment 11)

Embodiment 11 of the present invention is modifications of the devices in the structures shown in FIGS. 12A and 12B, as obtained by making the metal layer 203, 213 of a metal material not to cause the silicide reaction with the second semiconductor region 204, 214. When an Al—Si alloy was used as the metal material not to cause the silicide reaction, the second semiconductor region 204, 205, 206 or 214, 215, 216 did not react to form a silicide with the metal 207, 203 or 217, 213 even if the impurity concentration of the second semiconductor region 204, 214 was $5 \times 10^{17}$ cm$^{-3}$. The technique using the metal material not to be silicified in the present embodiment is very effective to prevent the second semiconductor region from erroneously reacting upon writing, similarly as by the techniques shown in Embodiments 9, 10. Although the present embodiment showed an example in which all metals 203, 207, 213, 217 were made of the metal not to form a silicide, the metal may be used for some of the metal layers without a need to be limited to the present embodiment. For example, it is possible that the layer 203, 213 is made of a plurality of conducting materials and among them only the portion in contact with the second semiconductor region is made of the material not to be silicified.

The structures of the present devices can prevent the silicide reaction from taking place in unintended portions, and can realize high-integration memories which are stable in operation and high in reliability.

Next, the semiconductor devices of the present invention and application examples thereof will be described referring to FIGS. 17A, 17B to FIG. 30.

(Embodiment 12)

Figure 18A:
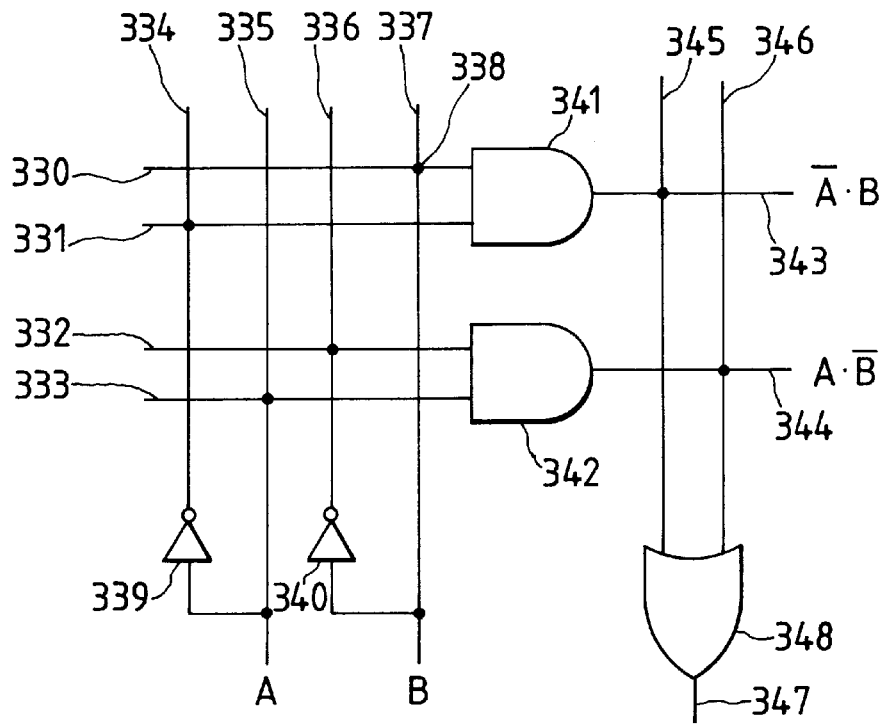
FIGS. 18A and 18B are a circuit diagram and a diagrammatic drawing to show the semiconductor device of Embodiment 12.
Figure 18B:
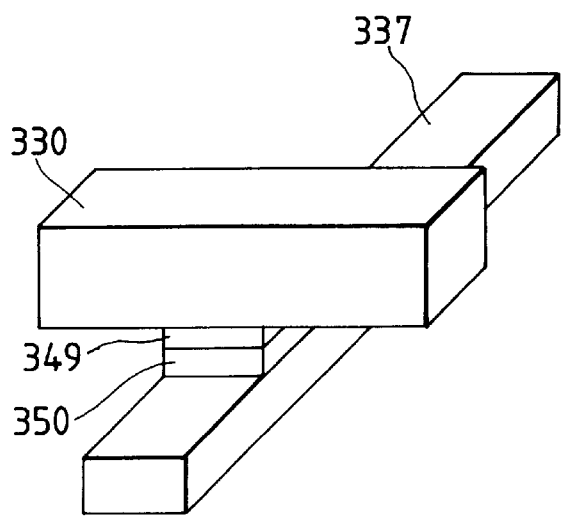

FIGS. 18A and 18B show the twelfth embodiment of the present invention. It is a well-known fact that any logical function can be expressed by a combination of AND logics with OR logics. This circuit is a so-called programmable logic array (PLA) that can realize an arbitrary function by preliminarily preparing AND circuits and OR circuits and arbitrarily determining connection or insulation of input/output lines of these circuits after the IC fabrication process. For simplification of description, the present embodiment is described with an example of exclusive OR (XOR) of two inputs.

In FIG. 18A, each of 341, 342 is a two-input AND circuit, and 348 is a two-input OR circuit. Numerals 339, 340 designate inverters. These circuits can be fabricated by the ordinary IC process technology. Numerals 330 to 337, 343 to 347 are input/output lines. These wires may be of a metal or any other conductor. The lines 330 to 333 are formed from a layer different from a layer of the lines 334 to 337, and the lines 343 and 344 are formed of a layer different from that of the lines 345, 346.

FIG. 18B shows a structure of an intersecting point 338 between the line 330 and the line 337 in FIG. 18A. A layer denoted by 349 is a metal layer, to which an amorphous semiconductor layer 350 is in contact. When either the line 330 or 337 is a metal, the metal layer 349 may be present or absent. A plurality of the structures in which the amorphous semiconductor layer is in contact with the metal layer may be disposed between the lines 330 and 337.

For example, when a voltage is applied between the lines 330 and 337 to cause breakdown in the amorphous semiconductor layer 350 so as to form a low-resistance silicide, the lines 330 and 337 can be electrically selected to be electrically connected. Each solid dot, for example as represented by 338 in FIG. 18A, indicates that two lines are selectively connected, and connection of these can be selectively done at a final stage of IC fabrication process or after completion of the entire process.

For example, if connection between lines is as shown in FIG. 18A, a value of output 347 for inputs A, B becomes an exclusive OR of A and B. The present example shows connection of lines for achieving exclusive OR, but all logic operations for two inputs can be realized by changing the way of connecting the lines.

Two inputs were considered herein, but numbers of inputs, AND circuits, and OR circuits can be arbitrarily increased as needed, whereby an arbitrary logic function of multiple inputs can be similarly achieved.

It is also needless to mention that the technology for arbitrary connection between lines can be applied not only to PLA, but also to field programmable gate arrays (FPGA) for arbitrarily connecting lines between a lot of arithmetic units.

(Embodiment 13)

Figure 20A:
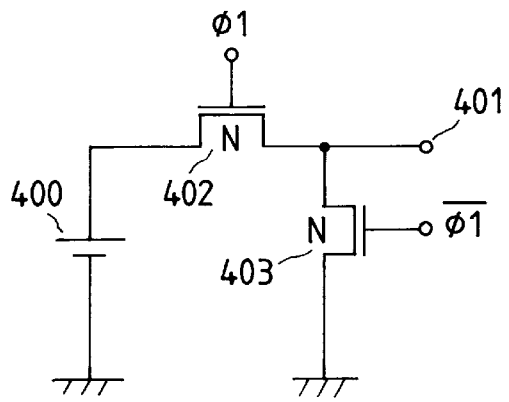
FIGS. 20A to 20E are circuit diagrams to illustrate switches in FIG. 19.
Figure 20B:
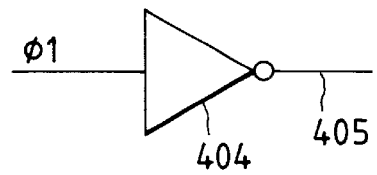

FIG. 19 shows a read only memory (ROM) as the thirteenth embodiment of the present invention. Switches 390, 391 in FIG. 19 can be realized using nMOS as shown in FIG. 20A, but they may be constructed of a CMOS inverter as shown in FIG. 20B. In FIG. 20A, a voltage of node 401 is a power-supply voltage appearing through a transistor 402 when φ1 is "1," or the ground voltage appearing through a transistor 403 when φ1 is "0". In FIG. 20B, the ground voltage appears at an output terminal 405 when φ1 is "1," or the power-supply voltage appears at the output terminal 405 when φ1 is "0".

Also, switches 392, 393 each are a switch for permitting a node 370, 373 to be set in either one of three states: a state wherein it is coupled with a power-supply voltage terminal, a state wherein it is coupled with a ground terminal, and a floating state. These switches can be realized using nMOS as shown in FIG. 20C.

Figure 20C:
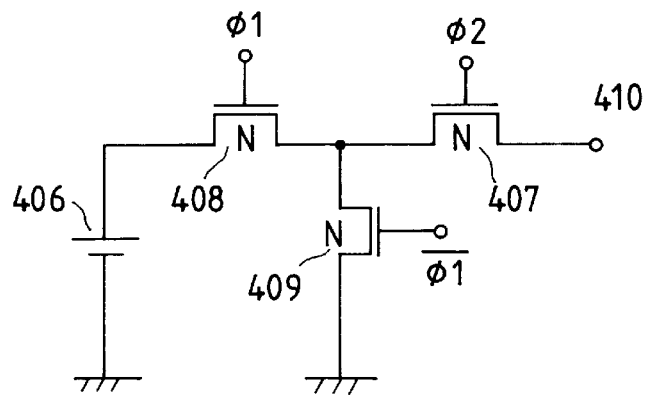
Figure 20D:
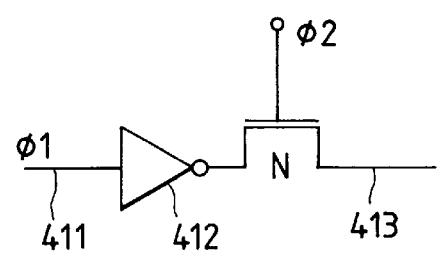

As shown in FIG. 20D, the switches may be constructed of a CMOS inverter and an nMOS transistor. In FIG. 20C, a node 410 becomes floating when φ2 is set to "0" to cut off a transistor 407. While φ2 is "1," the power-supply voltage appears through transistors 408, 407 at node 410 with φ1 being set to "1"; the ground voltage appears at node 410 through transistors 409, 407 with φ1 being set to "0". In FIG. 20D, node 413 becomes floating when φ2 is set to "0". While φ2 is "1," the ground voltage appears at node 413 with φ1 being set to "1"; the power-supply voltage appears at node 413 with φ1 being set to "0".

Figure 20E:
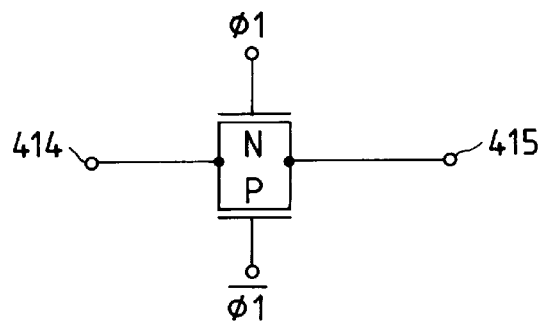

In FIGS. 20A and 20C, the nMOS transistors 402, 403, 408, 409, 407 may be replaced by pMOS transistors or analog switches in the CMOS structure as shown in FIG. 20E. In the analog switch of the CMOS structure, a same voltage as a voltage at node 414 appears at 415 when φ1 is set to "1".

Figure 21:
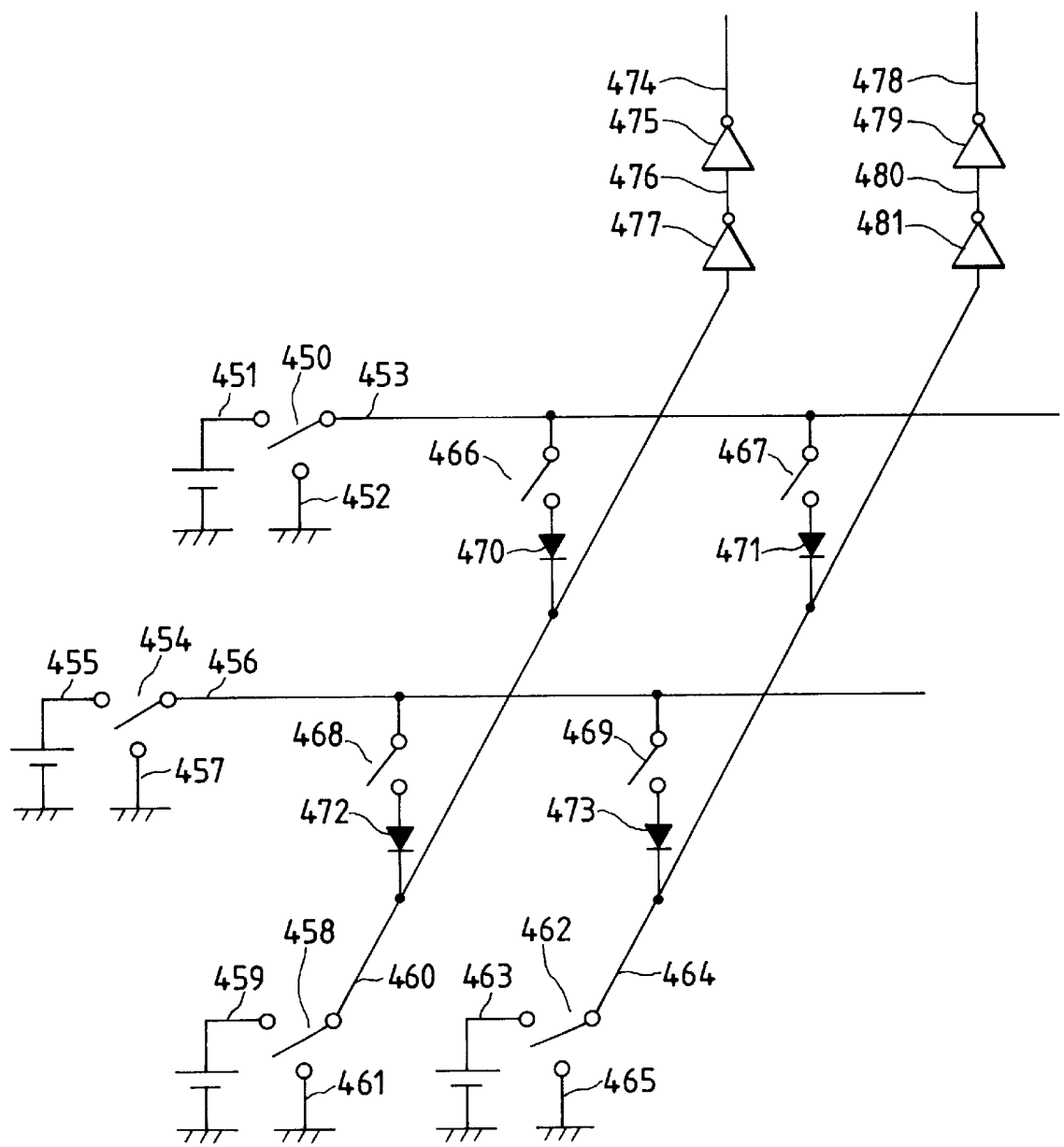
FIG. 21 is an equivalent circuit of the ROM of FIG. 19.

An equivalent circuit of FIG. 19 is shown in FIG. 21. For simplicity of explanation, the arrangement of FIG. 19 is described using this equivalent circuit.

Writing into the ROM is first described. This writing may be conducted at the final stage of the IC process (for example, before packaging) or after completion of the entire IC process.

Switch 467 is an equivalent circuit indicating an insulating state by the amorphous semiconductor layer 388 in FIG. 19. Switches 466, 468, 469 similarly represent the respective amorphous semiconductor layers, all of which are in an off-state before writing. A pn diode 471 indicates a pn junction of 387, 386 in FIG. 19. Also, pn diodes 470, 472, 473 are similar to it.

Numerals 453, 456 are word lines and 460, 464 are bit lines. Each of switches 450, 454 is for example the switch shown in FIG. 20A or FIG. 20B, and each of switches 458, 462 is for example the switch shown in FIG. 20C or 20D. Each of 475, 477, 479, 481 is an inverter constituting a sense amplifier for amplifying a signal on a bit line and determining whether it is "1" or "0".

For explanation, a method for selectively turning an amorphous semiconductor represented by switch 468, into a low-resistance silicide to equivalently turn on the switch 468 is described. In fact, any amorphous semiconductor can be selectively turned into a low-resistance silicide as well as the switch 468. An amorphous semiconductor at an arbitrary position can be selectively turned into a low-resistance silicide by the same method with arbitrarily increased numbers of word lines and bit lines.

Initially, the switches 450, 454, 458, 462 all are set to the ground electrode side to ground all word lines and bit lines.

Then the switch 462 is connected to the voltage supply side to turn a potential of bit line 464 into the power-supply voltage VDD. On this occasion, the voltage of VDD is applied to between the word lines 456, 453 and the bit line 464, but from the direction of this voltage it becomes a backward bias for pn junctions 471, 473. Setting the resistance of the pn junctions under the backward bias as to be sufficiently greater than that of the amorphous semiconductor layers, most of the voltage applied between the word lines 456, 453 and the bit line 464 is applied to the pn junctions. Therefore, no breakdown is caused in the amorphous semiconductor regions represented by switches 467, 469, which are thus always kept as high-resistance layers.

Since no voltage is applied between the word lines 456, 453 and the bit line 460, no breakdown is caused at this point in the amorphous semiconductor regions represented by switches 466, 468, which are thus always kept as high-resistance layers.

Next, when the switch 454 is turned to the terminal 455 to raise the potential of word line 456 to VDD, the voltage VDD is applied between the word line 456 and the bit line 460, and no potential difference between the word line 456 and the bit line 464.

Since no voltage is applied between the word line 456 and the bit line 464, no breakdown occurs at this point in the amorphous semiconductor region represented by switch 469, which is thus always kept as a high-resistance layer.

However, the voltage VDD is applied between the word line 456 and the bit line 460 and the direction thereof is the forward direction for pn junction 472. Thus, the resistance of the pn junction at this moment becomes sufficiently smaller than the resistance of the amorphous semiconductor region represented by switch 468, so that most of VDD is applied to the amorphous semiconductor region represented by switch 468. Accordingly, breakdown occurs in the amorphous semiconductor region represented by switch 468, which becomes a low-resistance silicide. The switch 468 is thus equivalently turned on. This results in writing "1" in a memory cell at the intersecting point between the word line 456 and the bit line 460.

Summarizing the sequential writing operation, "1" can be written in memory cells at arbitrary places by repeating the following three operations.

(1) Setting potentials of all word lines and bit lines to the ground.

(2) Keeping a potential of a bit line to which a memory cell is desired to be written is connected at the ground, and to turn potentials of the other bit lines to VDD.

(3) Turning a potential of a word line to which the memory cell desired to write is connected, to VDD.

Writing can be done simultaneously for a plurality of memory cells connected to one word line. Always selecting one word line, writing can be done simultaneously for arbitrarily selected memory cells out of the all memory cells connected to the address line, at most for the all memory cells.

The simultaneous writing for a plurality of memory cells can curtail the writing time. This method is effective for cases of writing a lot of large-capacity data such as moving pictures. It is, however, difficult to perform simultaneous writing for switches 468 and 469 in the circuit shown in FIG. 21. The reason is as follows. For example, if the switch 468 is written even a little faster than the switch 469, the word line is grounded by the switch 468, which will stop the voltage necessary for writing from being applied to the switch 469.

Figure 30:
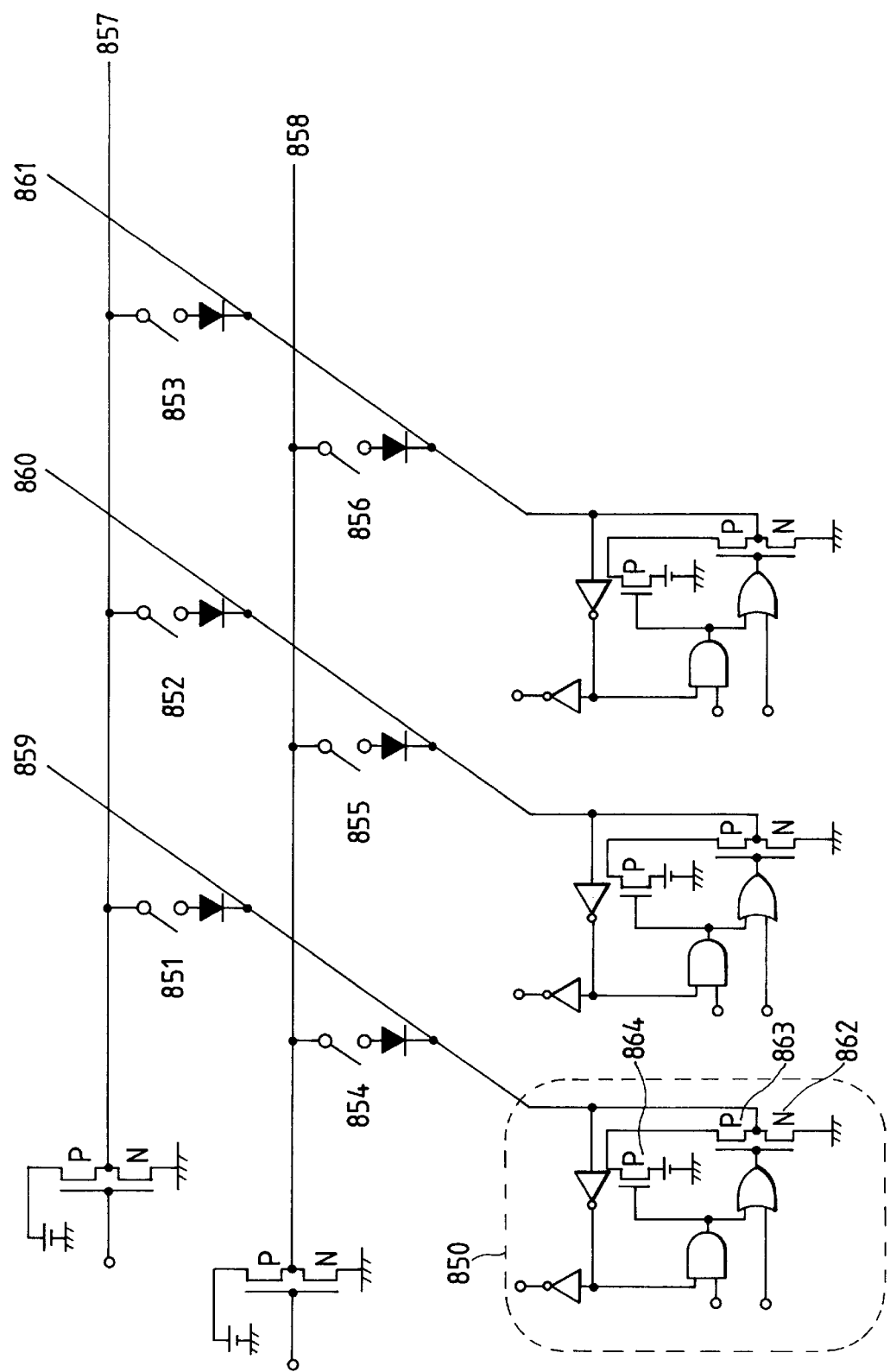
FIG. 30 is a circuit diagram of a semiconductor device having a detecting means for detecting completion of writing and a means for ending the writing.

FIG. 30 shows a structure to solve this problem and to enable simultaneous writing.

FIG. 30 shows a memory circuit including detection circuits 850 for detecting completion of writing by an electric current flowing through each bit line. This circuit monitors a potential of a bit line 859 to 861 under writing. At the moment of starting the writing operation, potentials of a word line 858 connected to memory cells which are desired to be written and the bit lines 859 to 861 are kept at VDD and the ground potential, respectively. When writing starts to turn a memory cell 854 into a low-resistance silicide, a large current flows to raise the potential of bit line 859 up to over Von (a threshold value of inverter 863, 862). Detecting it, the detection circuit 850 turns off an nMOS transistor 862 and turns on pMOS transistors 864, 863, whereby VDD is applied from 850 to the bit line 859, thus completing writing into the memory cell 854.

According to this operation, the voltage VDD is again applied to the other memory cells 855, 856 on the same word line to effect successive writing. Providing each bit line with this detection circuit enables simultaneous writing into a plurality of memory cells.

In the ROM of the structure of FIG. 19, an insulating film, for example, such as a silicon dioxide film, covers the surroundings of lines 382, 383, 384, 385, metal layer 389, amorphous semiconductor layer 388, p layer 387, and n$^+$ layer 386. For example, a possible way is such that an insulating film is first formed in a liquid phase such as ultrapure water in which ozone dissolves, hydrogen peroxide, or a mixed solution of sulfuric acid and hydrogen peroxide, and that thereafter a thick oxide film is formed by CVD or the like. Supposing the semiconductor is for example of silicon, in each memory cell part a dielectric constant of silicon is three times greater than that of the silicon dioxide film. Thus, when an electric field is applied to the amorphous semiconductor layer upon writing, electric lines of force develop toward silicon with the greater dielectric constant. This can prevent the so-called edge effect where the electric field is concentrated at a corner. Then the breakdown current flows over the entire surface as well as at the corner of amorphous semiconductor layer, thus permitting a uniform low-resistance metal semiconductor layer to be formed over the entire surface. This is a very significant advantage to lower the resistance of a device and to increase the operation speed. If the metal layer 389 and amorphous semiconductor layer 388 are switched, electrons flow from the metal layer into the amorphous semiconductor layer upon writing, and the flow of the electrons push metal atoms into the amorphous semiconductor layer, which facilitates resistance reduction of the amorphous semiconductor region.

If influence of heating becomes problematic in case of simultaneous writing, writing should be carried out while cooling the substrate with a liquid or fluid.

Figure 22:
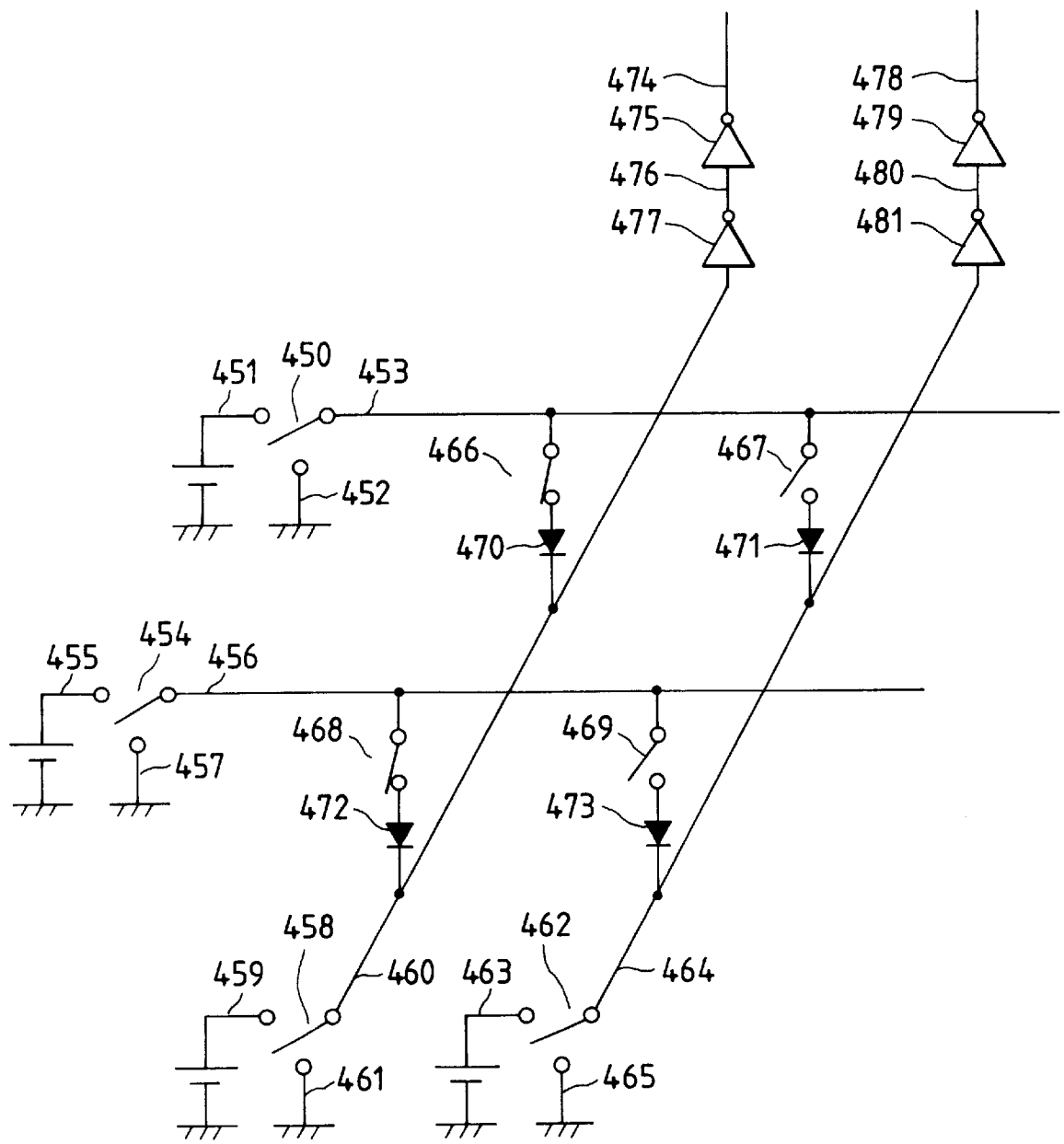
FIG. 22 is an equivalent circuit after writing, of the ROM.

Next described is a method for reading out information written. FIG. 22 shows an equivalent circuit in which only amorphous semiconductor regions represented by switches 466, 468 are turned into a low-resistance silicide (that is, data of the memories is "1").

For simplicity of explanation, here is considered a case in which only the amorphous semiconductor regions represented by switches 466, 468 are turned into a low-resistance silicide, but amorphous semiconductor regions in memory devices at arbitrary places may be turned into a low-resistance silicide in actual applications.

Initially, all switches 450, 454, 458, 462 are set on the ground electrode side, so that all word lines and bit lines are grounded.

Next, the switches 458, 462 are cut off from the ground to bring the bit lines 460, 464 into a floating state.

After that, for example, switch 454 is turned to the power supply side to change the potential of word line 456 to the power-supply voltage VDD. Since the switch 468 is in an on state and the pn junction is biased in the forward direction, an electric current flows from the word line 456 into the bit line 460 to raise the potential thereof. If the threshold value of inverters 477, 481 is set a little higher than the ground potential and when the potential of bit line 460 exceeds the threshold value of inverter 477, the inverter 477 is inverted so as to invert the inverter 475 as well, whereby a value of output node 474 changes from "0" to "1". From this output change, it is known that the amorphous semiconductor layer represented by switch 468 is actually turned into a low-resistance silicide. Namely, that the information in the memory cell is "1" can be read out.

On this occasion, the switch 466 is also short-circuiting, but the potential of word line 453 is the ground potential and the potential of bit line 460 a positive potential. Thus, the pn junction 470 is biased in the backward direction, so that no current flows from the bit line 460 to the word line 453.

As for the bit line 464, because the switch 469 is off, no current flows between the word line 456 and the bit line 464, and the potential of bit line 464 is kept at the ground potential. Accordingly, the output terminal 478 is always "0," from which it is known that the amorphous semiconductor layer represented by switch 469 maintains the insulating state. Namely, that the information in the memory cell is "0" can be read out.

Next, in order to read out the information in the memories represented by switches 466, 467, after the all word lines and bit lines are again set to the ground potential, the all bit lines are made floating, and then the word line 453 is raised to the power-supply voltage. The potential of bit line 460 is increased by an electric current flowing through the switch 466 and the forward pn junction 470. On the other hand, the bit line 464 is kept at "0" because the switch 467 is off.

Summarizing the sequential reading operation, information in memory cells at arbitrary places can be read out by repeating the following three operations.

(1) Setting the potentials of the all word lines and bit lines to the ground.
(2) Making the all bit lines floating.
(3) Changing the potential of a word line to which a memory cell desired to read is connected, to VDD.
(Data in the memory can be known from an output of a sense amplifier connected to each bit line on this occasion.)

After the bit line is raised a little bit higher than the ground potential, the information of "1" is read out. After that, once the read result is latched, the word line may be cut off thereafter from the voltage supply. This can decrease power consumption.

The present embodiment was described with the example including two word lines and two bit lines, but the numbers of word lines and bit lines are arbitrary, of course. Also in that case, the same theory can be applicable to writing information in an arbitrary memory cell and to reading information in an arbitrary memory cell.

A feature of this ROM is that very-high-speed reading becomes possible because information is read out through the low-resistance silicide and forward pn junction with a memory element being in a conducting state (when it stores information of "1"). Since conventional ROMs used MOS transistors, which were surface devices, as switch devices, the electric current was small, which made it difficult to increase the operation speed. In contrast, because the electric current flowing in the forward pn junction exponentially increases against the voltage applied to the junction, a larger electric current can flow as compared with the MOS transistors as surface devices, which enables the operation speed to be increased.

A further significant feature is that this structure of ROM can be fabricated in perfect self alignment in the IC process. For example, in FIG. 19, the layers of line 385, $n^+$ layer 386, p layer 387, amorphous semiconductor layer 388, and metal layer 389 are continuously formed and are etched in longitudinal wiring patterns all together. Next, peripheral portions are covered with an insulating film, for example such as a silicon dioxide film, and after being flattened, the layer of line 382 is formed and then etched in wiring patterns perpendicular to the previous wiring patterns this time down to right above the lowermost lines 384, 385. Finally, again covering it with an insulating film, the ROM part of FIG. 19 is obtained.

This process permits memory cells to be aligned at the wiring intervals, thus realizing high integration. The wiring intervals are determined by the minimum processing length in the IC fabrication steps, which realizes very-high-density ROM. Letting L be the minimum processing length, an area occupied by a memory cell is $4L^2$, which is a degree of integration so high as not to be realized by the conventional ROMs using MOS transistors with elements being two-dimensionally formed on the substrate surface.

Since vertical lamination of such structures is easy in the IC process, the degree of integration can be further increased in the same chip area.

Figure 31:
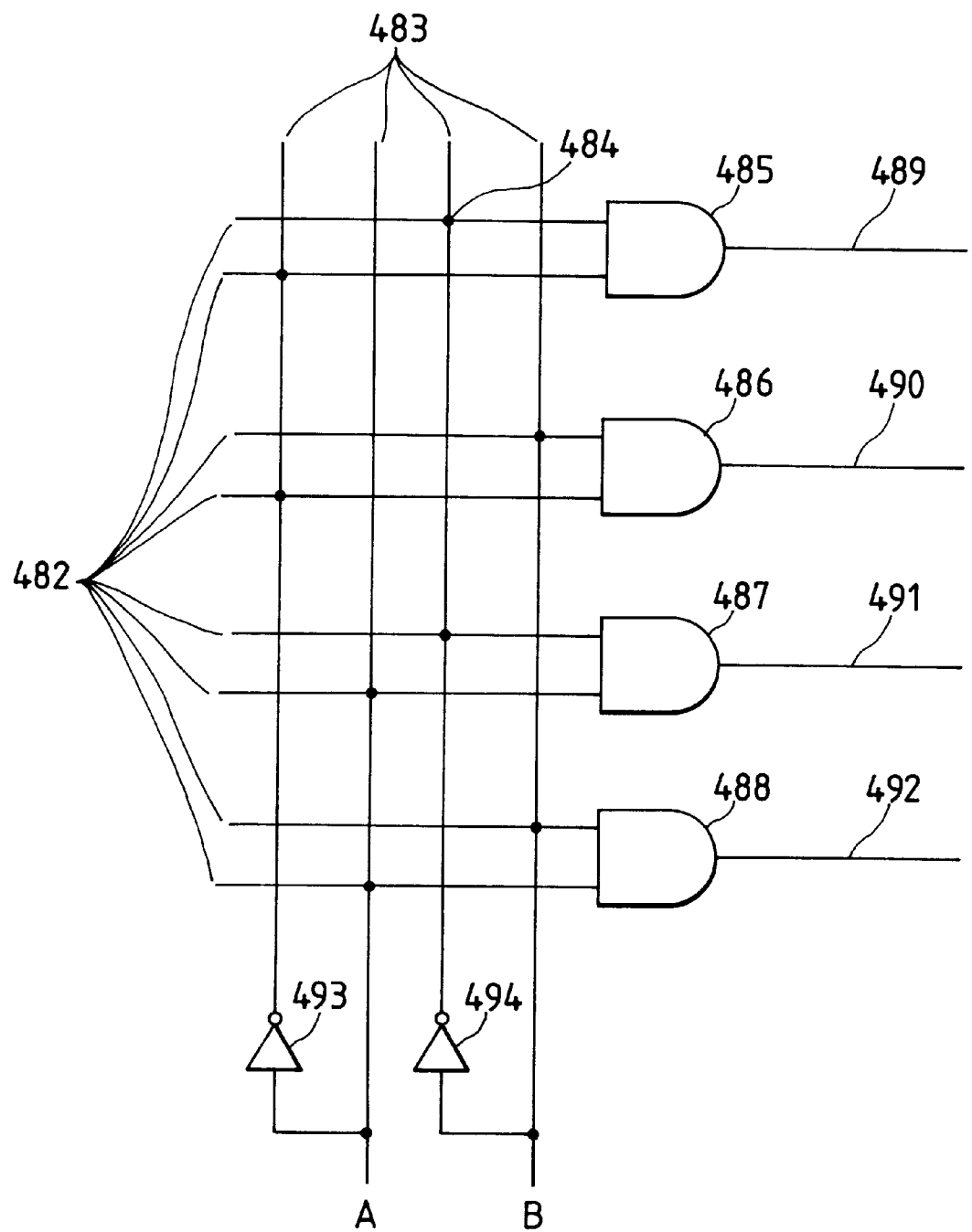
FIG. 31 is a circuit diagram to show an example of a decoder embodying the present invention.

The present embodiment employed a method for connecting each word line or bit line directly to the voltage supply or the ground, but the switches 450, 454, 458, 462 in FIG. 21 may be constructed of a decoder as shown in FIG. 31 if there are a lot of word lines and bit lines. This is a circuit for selecting one output out of four outputs 489, 490, 491, 492 and setting the selected output to "1" while setting the other outputs to "0".

A solid dot represented by 484 indicates that a state of mutual connection between lines 482 and 483 is electrically short-circuited. Letters A and B represent inputs, and numerals 493, 494 inverters. Numerals 485, 486, 487, 488 are AND circuits, and an output 489 of 485 becomes "1" only when A is "0" and B is "0". An output 490 of 486 becomes "1" only when A is "0" and B is "1". An output 491 of 487 becomes "1" only when A is "1" and B is "0". An output 492 of 488 becomes "1" only when A is "1" and B is "1".

In this manner one out of four output lines can be selected using the two inputs A, B. Also, a floating state can be realized by connecting an nMOS transistor to each output line and setting a signal input into the gate thereof to "0".

When the circuit is of a large scale, an arbitrary output line can be selected out of many more output lines, using the same theory.

In this manner the decoder can be used to select the word line and bit line, but instead thereof, random logic may be used to perform the same operation, of course.

Figure 23A:
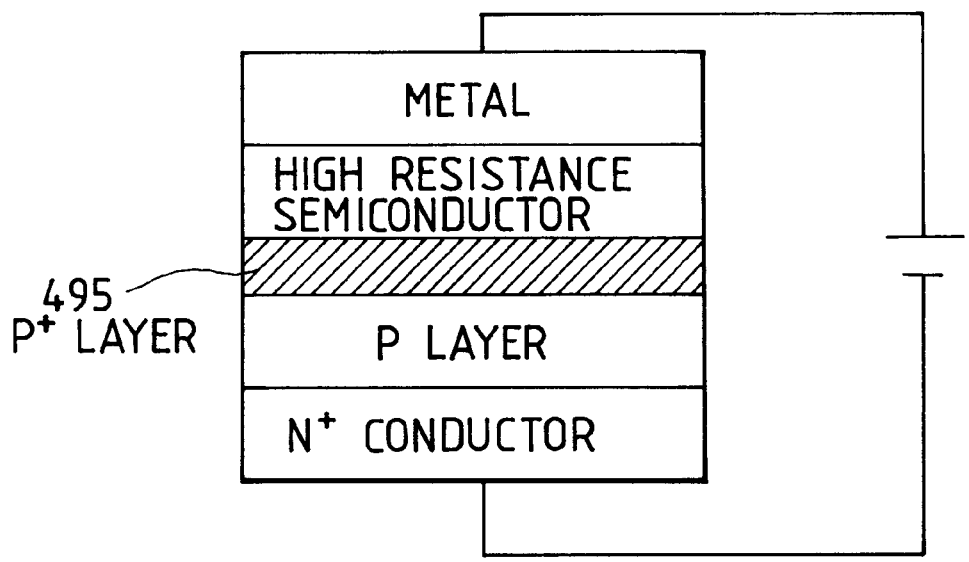
FIGS. 23A and 23B are diagrammatic drawings to show further examples of the semiconductor device of the present invention.

The structure of the memory cell shown in FIG. 19 may be modified in such a manner that a high-concentration layer 495 is sandwiched between the amorphous semiconductor and the p layer as shown in FIG. 23A. In this arrangement, after the reaction is finished between the metal and the amorphous semiconductor, the low-resistance silicide is in contact with the high-concentration layer to further decrease the contact resistance, thereby permitting a large forward current to flow.

Figure 23B:
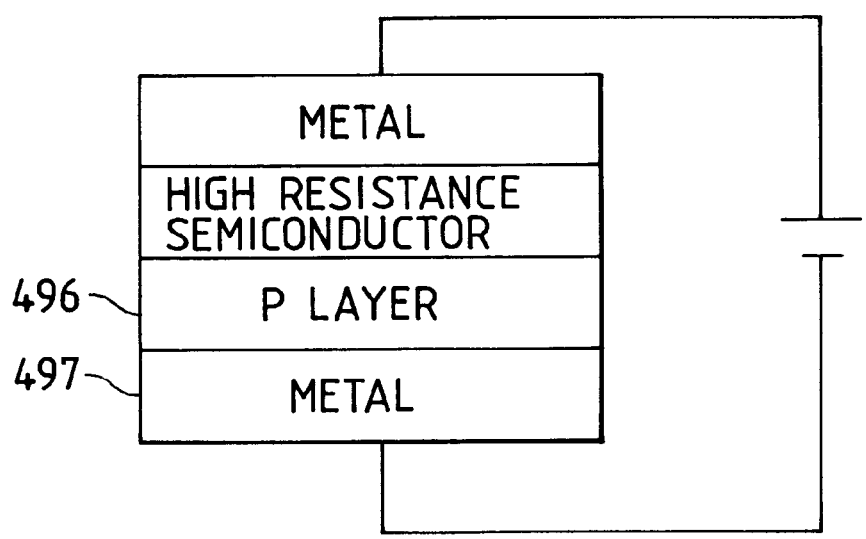

The present embodiment used the pn junction in ROM, but the pn junction may be replaced by a Schottky junction of semiconductor 496 and metal 497 as shown in FIG. 23B. This arrangement can permit a memory cell to have a rectifying property as in the case of the pn junction.

In the above arrangements, the direction of the pn junction or Schottky junction can be reversed as needed as long as the polarity of the power-supply voltage is also inverted.

(Embodiment 14)

Figure 24:
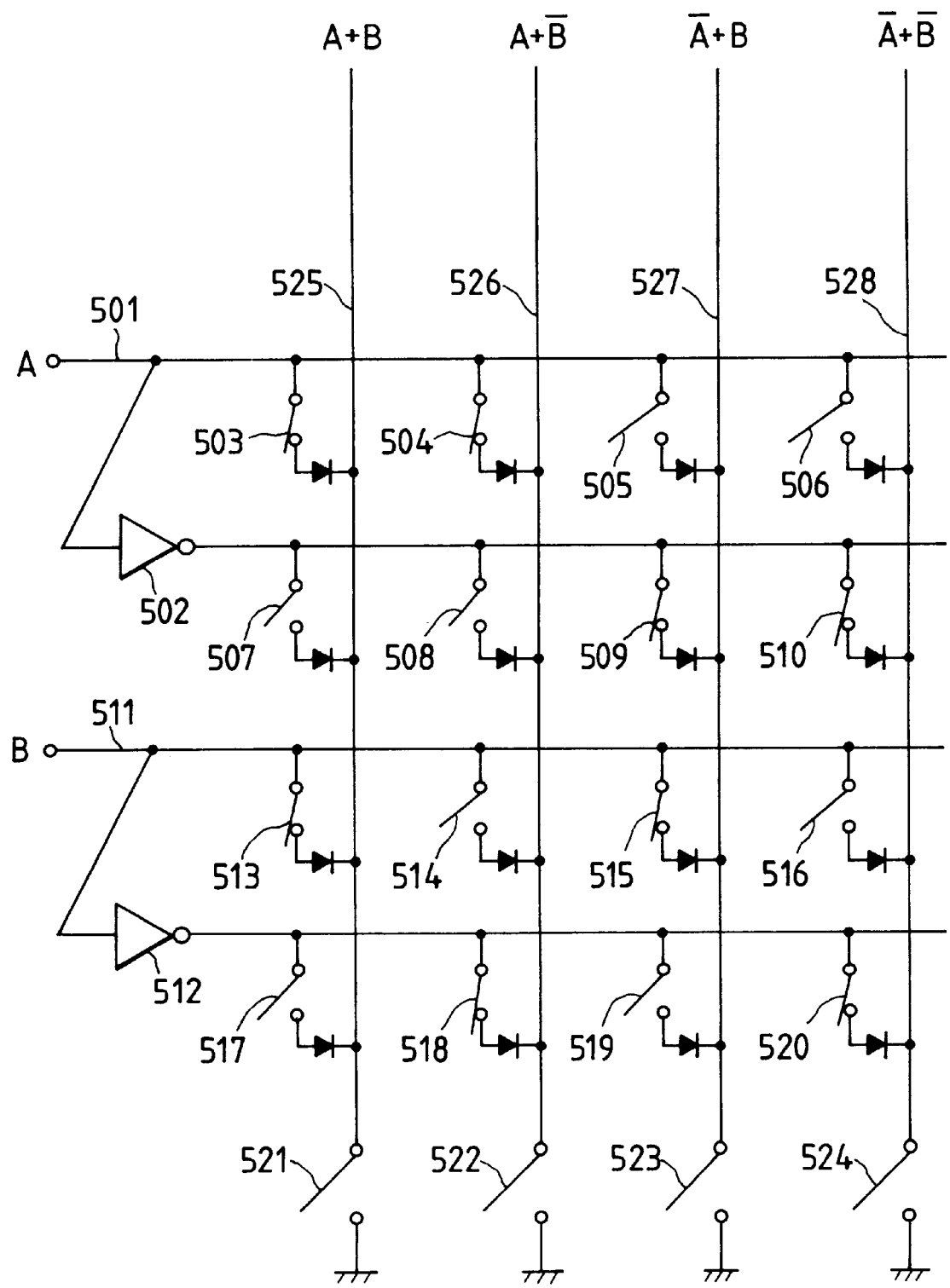
FIG. 24 is a circuit diagram to show the semiconductor device of Embodiment 14.

The fourteenth embodiment of the present invention is shown in FIG. 24.

FIG. 24 shows a circuit for outputting an inclusive OR of two inputs. Numerals 503 to 510, 513 to 520 each are composed of a switch and a pn diode, which indicate an amorphous semiconductor layer and a pn junction sandwiched between a word line 501, 511 and a bit line 525, 526, 527, 528. Here, switches turned on indicate that the amorphous semiconductor layer and metal layer were made to selectively react to form a low-resistance silicide.

Numerals 502, 512 each denote an inverter. Switches 521 to 524 are those for initializing each bit line to the ground potential. After initialization, when these switches are turned off to make the bit lines floating, an operation result appears on each bit line.

Since signals of A and B are electrically connected through the switches 503, 513 to the bit line 525, "1" appears on the bit line 525 if either one of them is "1". Namely, this is a calculation of an inclusive OR of A and B.

Similarly, an inclusive OR of A and the inversion of B appears on the bit line 526, an inclusive OR of B and the inversion of A appears on the bit line 527, and an inclusive OR of the inversion of A and the inversion of B appears on the bit line 528. Further increasing the numbers of input lines and output lines, an inclusive OR of an arbitrary combination of arbitrary inputs can be calculated by this method.

There are four ways in total to combine inputs of A and B, for each of which only one of the four bit lines 525 to 528 becomes "0" and the other lines become "1". Then, when an output of each bit line is inverted, only one out of the four bit lines 525 to 528 becomes "1" and the other three lines "0" for each way of combination of A and B, thus realizing the so-called decoder as shown in FIG. 30.

Figure 25:
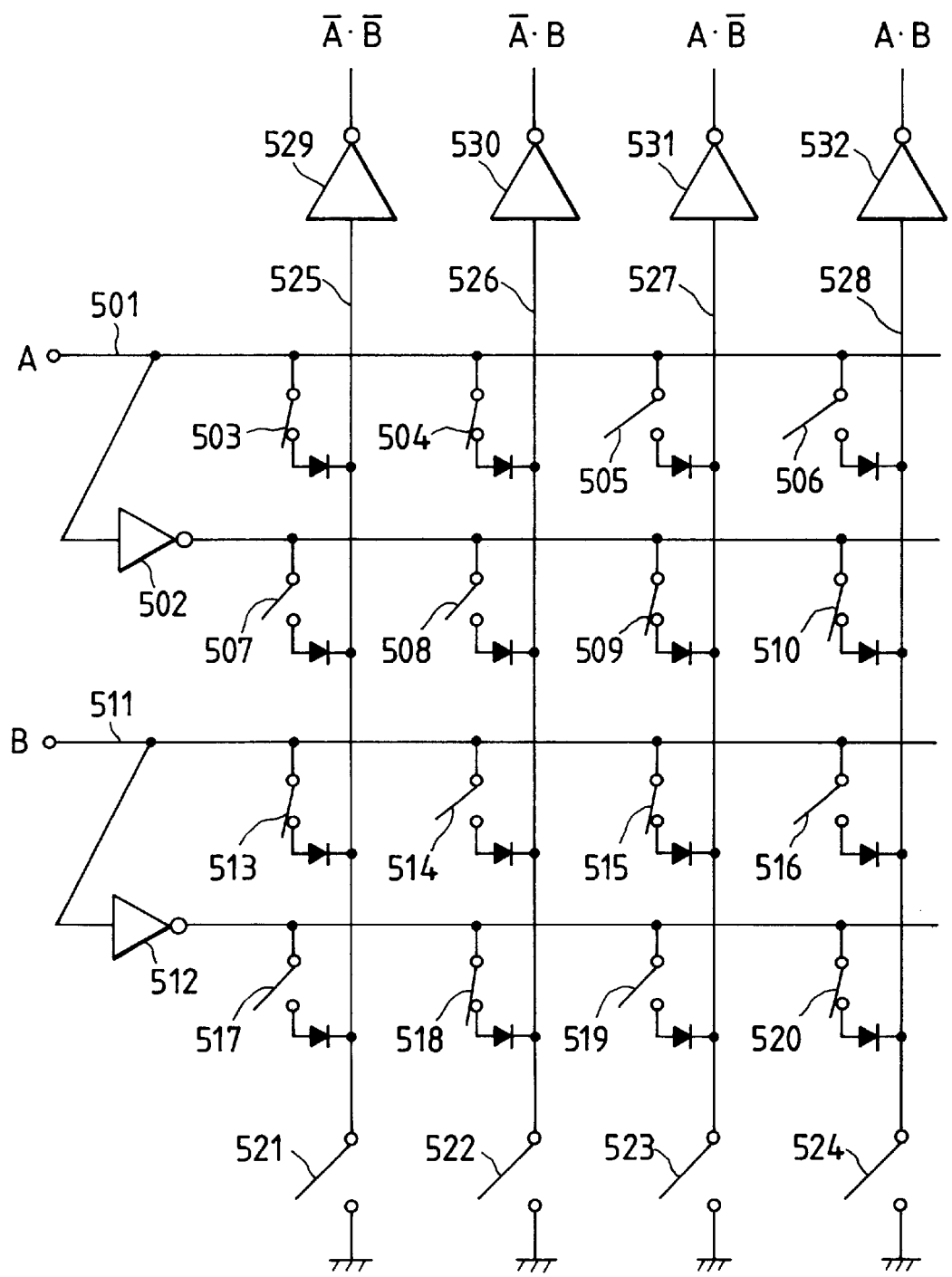
FIG. 25 is a circuit diagram to show the semiconductor device of Embodiment 14.

FIG. 25 shows a circuit for inverting an output of each inclusive OR in FIG. 24 by an inverter 529, 530, 531, 532 to output an inverted output. An output inverted by inverter 529 is indicated by AND of the inversion of A and the inversion of B. An output inverted by the inverter 530 is indicated by AND of B and the inversion of A. An output inverted by the inverter 531 is indicated by AND of A and the inversion of B. An output inverted by the inverter 532 is indicated by AND of A and B. Namely, the decoder is realized in such an arrangement that for each way out of the four combinations of A and B, only one out of the four outputs of 529 to 532 becomes "1" and the other three outputs become "0".

Further increasing the numbers of input lines and output lines, AND can be calculated for an arbitrary combination of arbitrary inputs.

Figure 26:
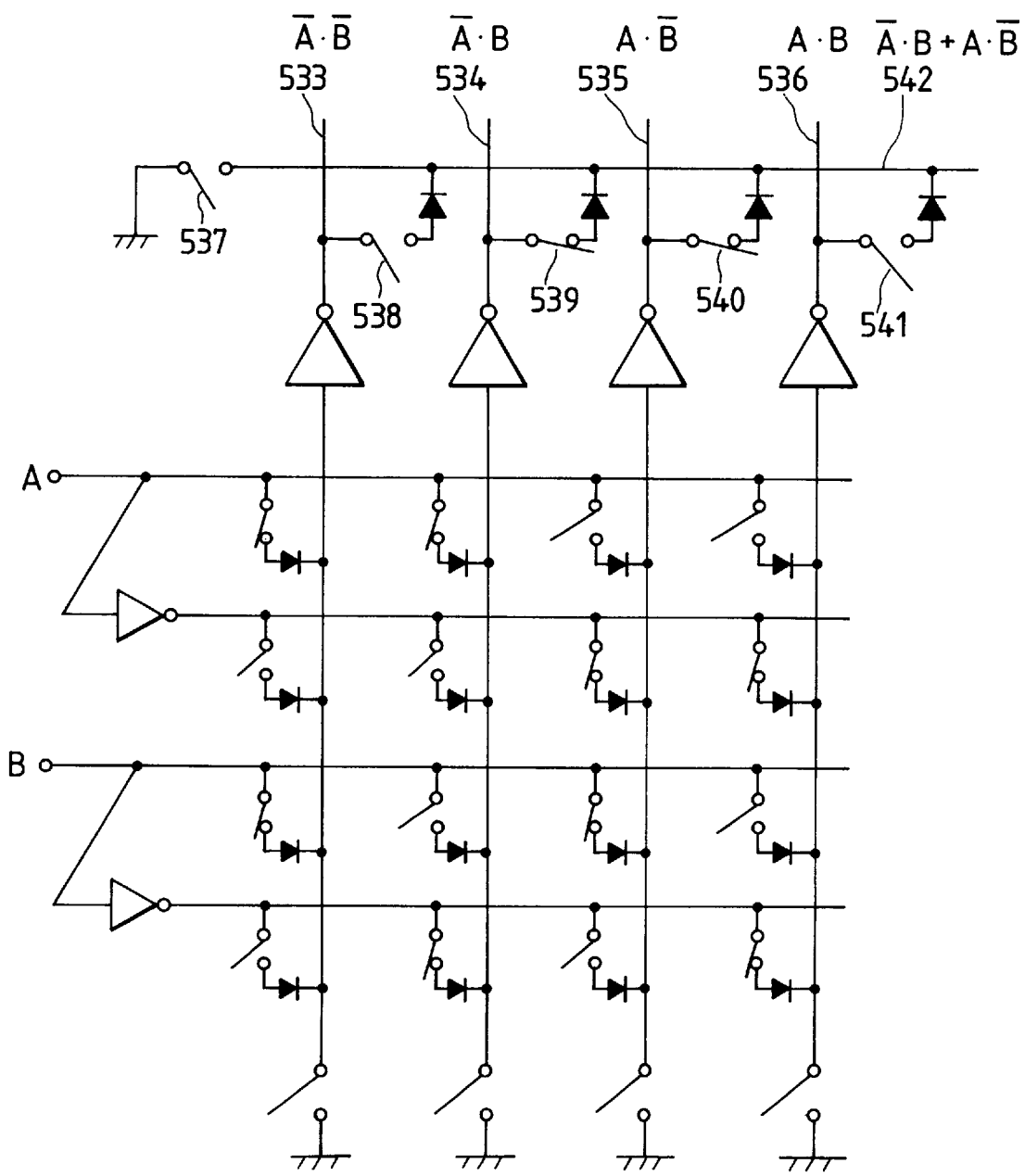
FIG. 26 is a circuit diagram to show the semiconductor device of Embodiment 14.

FIG. 26 shows an example which realized exclusive OR of two inputs, for example, using the circuit for calculating AND in FIG. 25 and the circuit for calculating inclusive OR in FIG. 24. Numerals 533, 534, 535, 536 are the same as the output lines in FIG. 25. Connection between these lines and an output line 542 is determined by combinations 538, 539, 540, 541 each of a switch and a diode. In this example, because the lines 534 and 535 are connected to the line 542, an inclusive OR of 534 and 535 is output to 542.

Accordingly, for inputs A, B, an exclusive OR of A and B appears on the line 542.

Since any logic operation can be realized by a combination of AND and OR, an arbitrary logic function can be realized by combining a logic plane for realizing AND with a logic plane for realizing OR in this manner. Here was described the example of exclusive OR of two inputs, but an arbitrary logic function of an arbitrary number of inputs can be realized by using the AND plane and OR plane of multiple inputs and multiple outputs. Further, using the AND plane and OR plane of multiple inputs and multiple outputs, a circuit can be produced in such an arrangement that a group of arbitrary signals are input and a group of arbitrary signals corresponding thereto in one-to-one correspondence are output, without a need to specify.

Such a logic circuit can be said to be the same concept as PLA shown in FIG. 18A, but a difference resides in that ROM itself realizes the functions of AND circuit and OR circuit in FIG. 18A.

(Embodiment 15)

Figure 27:
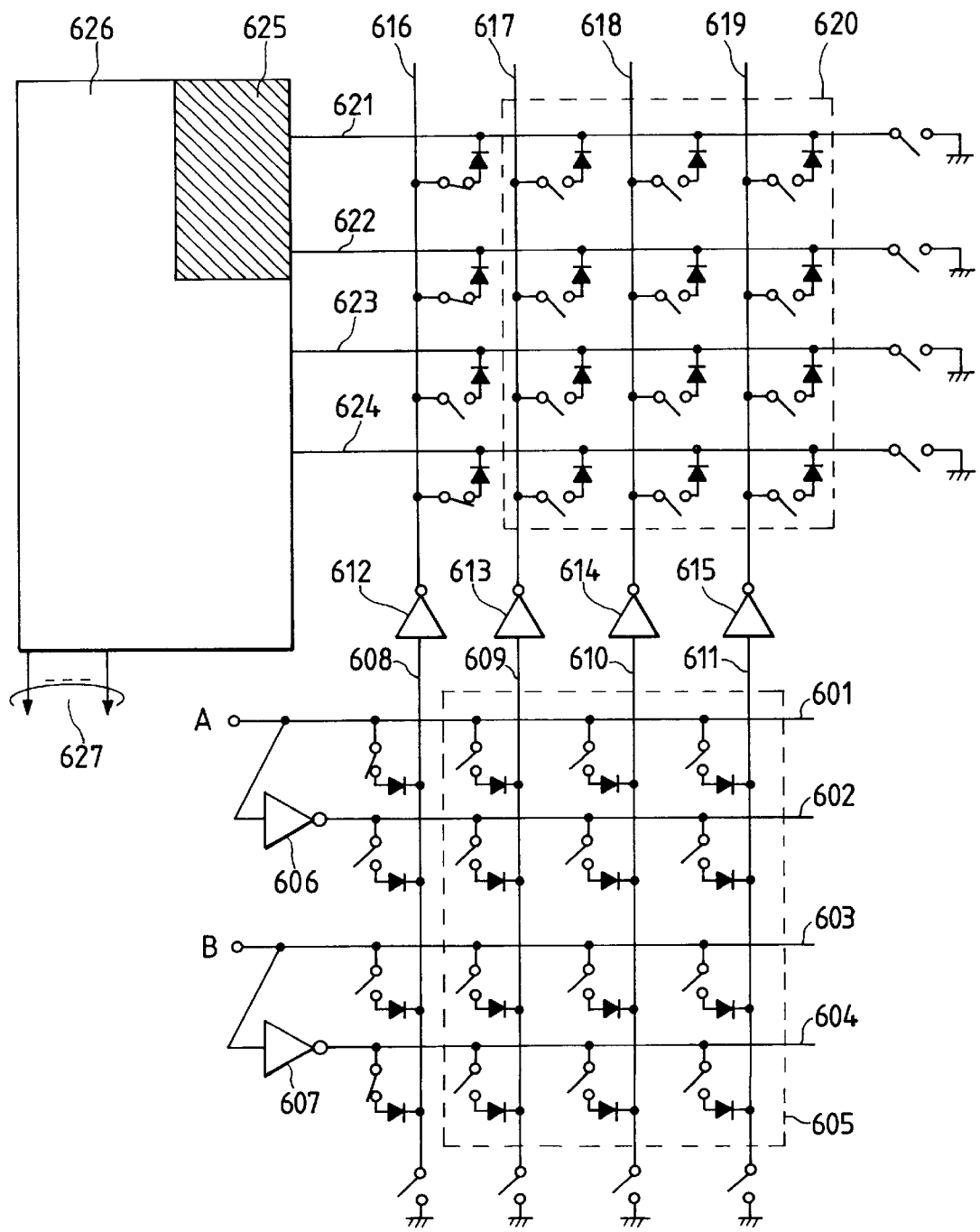
FIG. 27 is a diagrammatic drawing to show a data retrieving system using the ROM of the present invention.

FIG. 27 shows the fifteenth embodiment of the present invention. FIG. 27 shows a data retrieving system using ROM. An example of the data retrieving system is book retrieval, which is a system arranged in such a manner that when a field or an author's name of a book desired to be read is input out of a huge number of books, all books related thereto are output for example. Conventional systems of this type were arranged to retrieve numerous book data stored in a magnetic memory medium or a compact disk, on a software, and it was thus difficult to increase the speed of access to data or arithmetic operation. A very-high density ROM is necessary for storing numerous book data on a high-speed-accessible hardware. Also, the ROM must be a programmable ROM of a type in which a user can write information later on, thus requiring a high-speed-accessible and high-density, programmable ROM.

The features of the retrieving system shown in the present embodiment are that a medium for storing information is realized by a high-speed and high-density ROM and that an arithmetic operation unit itself for calculating which data should be output based on data input is also realized by a high-speed and high-density ROM.

In FIG. 27, information of "1, 0, 0, 1" is written in four memory elements connected to a line 608, whereby the line 608 becomes "0" and a line 616 becomes "1" only when A="0" and B="1".

Information of "1, 1, 0, 1" is written in four memory devices connected to the line 616, and when the line 616 becomes "1," "1, 1, 0, 1" is output to lines 621, 622, 623, 624, respectively.

Supposing this output information is information, for example, indicating an address of the part of 625 in ROM 626, the information of 625 can be output to output lines 627.

This sequential operation enables information in ROM corresponding to certain inputs A, B to be read out. For example, the system may be so arranged that the inputs A, B indicate an author's name of books, all books of the author are written in the part of 625 in ROM 626, and an address thereof is written in the memory cells connected to the line 616, whereby the books are automatically output with input of the author's name.

This system can be constructed all in the same structure except for some peripheral circuits such as inverters, and thus is very easy to design. When data is added to ROM 626, new information corresponding to an added address may be written in unused portions 605, 620.

For example, if the information in all memory cells connected to 608 is rewritten into "1," the line 608 always becomes "1" and the line 616 is always "0" for all combinations of inputs A, B. Namely, access is not allowed to the information (address) in the memories connected to the line 616. If once written data is desired to be rewritten into new data, the new data may be written in an unused portion after disabling access to old data by this method.

Here, the description concerned the example of book retrieval, but it is also possible that the inputs A, B supply an input of a code of an operation command and that execution procedures of the command are written for example in 625 in ROM. In another arrangement, various application softwares, which used to be stored in magnetic media, are written in ROM and a command code for starting a software is input as the inputs A, B. If an application software is upgraded to a new version and if a new software is desired to be again installed, the new software can be installed while disabling access to the old address by the above procedures.

The input does not have to be two bits of A, B, but may be an arbitrary number of bits. Also, the scale of system is arbitrary without a need to specify.

(Embodiment 16)

Figure 28:
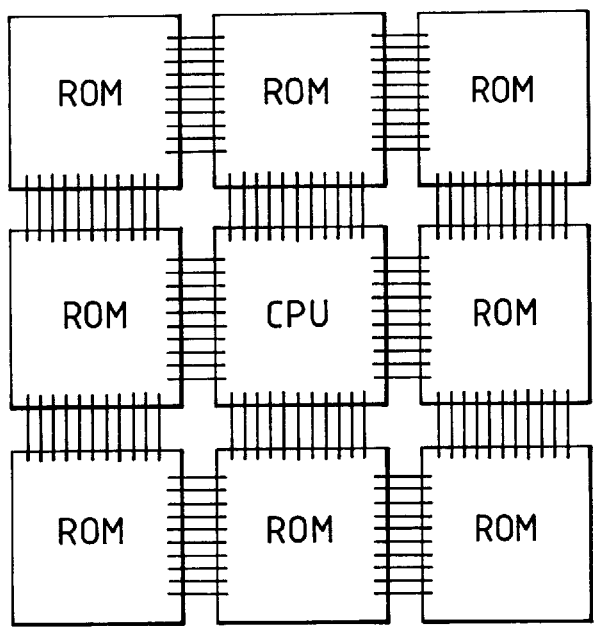
FIG. 28 is a diagrammatic drawing to show a hybrid system using the ROMs of the present invention.

FIG. 28 shows the sixteenth embodiment of the present invention.

FIG. 28 shows a so-called hybrid type system in which high-concentration and high-speed ROMs realized by the present invention are arranged around a chip containing CPU and are directly connected thereto by bonding wires. Instruction codes of CPU and various application softwares may be written all in the ROMs. Also, the ROM with data retrieving function as described above may be arranged around CPU.

It is almost impossible from the viewpoint of miniaturization to use a magnetic disk or compact disk as a recording medium in palm-size mobile information devices, and it thus becomes necessary to place high-integration electronic memory media, for example as in the present embodiment, in high density directly around a processing element.

The present invention can provide the low-resistance and highly reliable antifuse. This makes it possible to cheaply provide the programmable logic arrays (PLA) that can realize an arbitrary function, the field programmable gate arrays (FPGA) that can arbitrarily connect lines between a lot of arithmetic operation units, and the semiconductor devices such as high-speed and high-density ROM, and further to cheaply provide ultra-compact audio and video recording media which could replace the magnetic tapes or compact disks.

What is claimed is:

1. A semiconductor device utilizing a silicide reaction, which comprises a plurality of cells each having a semiconductor layer between a pair of conductors, wherein at least one of said pair of conductors comprises a metal, said semiconductor layer comprises an amorphous silicon, and a conical metal silicide region extending between said pair of conductors, wherein said amorphous silicon forms the silicide at a reaction rate of not less than 10 m/sec with said metal to provide the conical metal silicide region.

2. A semiconductor device utilizing a silicide reaction, which comprises a plurality of cells each having a semiconductor layer between a pair of conductors, said semiconductor layer comprises an amorphous silicon, at least one of said pair of conductors comprises a metal which undergoes a silicide reaction with the amorphous silicon, and a conical metal silicide region extending between said pair of conductors.

3. A semiconductor device utilizing a silicide reaction, which comprises a plurality of cells each having a semiconductor layer between a pair of conductors, wherein said semiconductor layer comprises amorphous silicon, wherein at least one of said pair of conductors comprises a metal and a conical metal silicide region extending between said pair of conductors, wherein the conical metal silicide region is formed by reaction between said metal and said amorphous silicon and wherein a film-formed surface is produced without being exposed to an oxygen atmosphere between a step of forming said amorphous silicon and a step of forming said metal.

4. The semiconductor device utilizing the silicide reaction according to any one of claims 1 to 3, wherein said amorphous silicon layer is an ion implant layer.

5. The semiconductor device utilizing the silicide reaction according to claim 4, wherein said amorphous silicon layer is a layer ion-implanted through said metal.

6. The semiconductor device utilizing the silicide reaction according to any one of claims 1 to 3, wherein a surface of said semiconductor device is covered with an insulating layer formed at a film-forming temperature of not more that 250° C.

7. The semiconductor device utilizing the silicide reaction according to any one of claims 1 to 3, wherein an electric current is let to flow in said amorphous silicon layer through said pair of conductors so as to cause the silicide reaction between said metal and said amorphous silicon, thereby electrically short-circuiting between said pair of conductors.

8. The semiconductor device utilizing the silicide reaction according to claim 7, wherein said electric current flows from said amorphous silicon layer into said metal.

9. The semiconductor device utilizing the silicide reaction according to any one of claims 1 to 3, wherein said pair of conductors each comprise a metal.

10. The semiconductor device utilizing the silicide reaction according to any one of claims 1 to 3, wherein said metal is a high-melting-point metal, an alloy containing the high-melting-point metal, or a compound of the high-melting-point metal.

11. The semiconductor device utilizing the silicide reaction according to any one of claims 1 to 3, wherein said metal comprises at least one of W, Ta, Ti, Co, Mo, Hf, Ni, Zr, Cr, V, Pd, and Pt.

12. The semiconductor device utilizing the silicide reaction according to any one of claims 1 to 3, which is formed in self alignment.

13. The semiconductor device utilizing the silicide reaction according to any one of claims 1 to 3, which is formed in self alignment by selective growth technology of metal or semiconductor.

14. The semiconductor device utilizing the silicide reaction according to claim 13, which is formed in self alignment by selective growth of W or Ti, and selective growth technology of silicon.

15. The semiconductor device utilizing the silicide reaction according to any one of claims 1 to 3, which comprises means for electrically detecting a change of a resistance between said pair of conductors.

16. The semiconductor device utilizing the silicide reaction according to any one of claims 1 to 3, which has means for detecting a change of a resistance between said pair of conductors due to said silicide reaction and means for stopping said reaction with the detection.

17. The semiconductor device utilizing the silicide reaction according to any one of claims 1 to 3, wherein said cell has a second semiconductor region with a rectifying property between said semiconductor layer and said conductor or on an opposite side to said semiconductor layer, of said conductor.

18. The semiconductor device utilizing the silicide reaction according to claim 17, wherein a structure to show said rectifying property is a pn junction.

19. The semiconductor device utilizing the silicide reaction according to claim 17, wherein a structure to show said rectifying property is a Schottky junction.

20. The semiconductor device utilizing the silicide reaction according to claim 17, wherein said second semiconductor region has a structure having a smaller resistivity than that of said semiconductor layer.

21. The semiconductor device utilizing the silicide reaction according to claim 20, wherein said semiconductor layer comprises a nondoped amorphous silicon or an amorphous silicon doped with a selected amount of boron and wherein said second semiconductor region comprises a silicon doped with an impurity.

22. The semiconductor device utilizing the silicide reaction according to claim 17, which has such a structure that said second semiconductor region comprises a semiconductor material having a silicide reaction rate of the silicide reaction slower than that of said first semiconductor region.

23. The semiconductor device utilizing the silicide reaction according to claim 22, wherein said semiconductor layer is an amorphous silicon formed by ion implantation and wherein said second semiconductor region is an amorphous silicon deposit film deposited by a vapor phase method, or a crystalline silicon.

24. The semiconductor device utilizing the silicide reaction according to claim 17, wherein a portion, in contact with said second semiconductor, of the conductor adjacent to said second semiconductor region out of said pair of conductors is formed of a metal not to react with said second semiconductor region, thereby not forming a silicide layer.

25. The semiconductor device utilizing the silicide reaction according to any one of claims 1 to 3, wherein a plurality of first conductive lines and a plurality of second conductive lines are arranged in a matrix and wherein said cells are provided in portions where said plurality of first and second conductive lines intersect.

26. The semiconductor device utilizing the silicide reaction according to claim 25, wherein said first conductive lines and said conductors in contact therewith are formed of a same material and/or wherein said second conductive lines and said conductors in contact therewith are formed of a same material.

27. The semiconductor device utilizing the silicide reaction according to claim 15, wherein said means for electrically detecting has means for inhibiting detection of the change of the resistance between said pair of conductors.

28. The semiconductor device utilizing the silicide reaction according to any one of claims 1 to 3, wherein said semiconductor device is a read only memory.

29. The semiconductor device utilizing the silicide reaction according to claim 28, wherein said read only memory can store data of at least 1 Gbits.

30. The semiconductor device utilizing the silicide reaction according to claim 28, wherein said read only memory is arranged to read out data in 20 nsec or less.

31. The semiconductor device utilizing the silicide reaction according to claim 29, wherein said read only memory is arranged to read out data in 20 nsec or less.

32. The semiconductor device utilizing the silicide reaction according to any one of claims 1 to 3, wherein electrical connection and insulation between arbitrary lines can be arbitrarily determined by said silicide reaction after completion of fabrication process, whereby a circuit function of a programmable logic array (PLA) or field programmable gate array (FPGA) can be arbitrarily set.

33. The semiconductor device utilizing the silicide reaction according to any one of claims 1 to 3, wherein connection and insulation of a gate electrode of a MOS transistor with a power supply or a ground electrode can be arbitrarily determined by said silicide reaction after completion of fabrication process.

34. The semiconductor device utilizing the silicide reaction according to any one of claims 1 to 3, wherein connection and insulation of a source electrode or/and a drain electrode of a MOS transistor with a power supply or a ground electrode can be arbitrarily determined by said silicide reaction after completion of fabrication process.

35. In a neuron MOS transistor having a semiconductor region of one conduction type on a substrate, source and drain regions of an opposite conduction type in said region, a floating gate electrode disposed through an insulating film in a region for separating said source and drain regions and being in a potentially floating state, and a plurality of input gate electrodes capacitance-coupling through an insulating film with said floating gate electrode, the semiconductor device utilizing the silicide reaction according to any one of claims 1 to 3, wherein connection and insulation of said plurality of input gate electrodes with a power supply or a ground electrode can be arbitrarily determined by said silicide reaction after completion of fabrication process.

36. The semiconductor device utilizing the silicide reaction according to any one of claims 1 to 3, wherein said silicide reaction is let to take place while cooling the substrate with a liquid or gas.

37. A semiconductor device utilizing a silicide reaction, which comprises a plurality of cells each having a semiconductor layer between a pair of conductors, wherein at least one of said pair of conductors comprises a metal, wherein said semiconductor layer comprises amorphous silicon and wherein a conical metal silicide region extends between said pair of conductors, said silicide region formed by reaction between said metal and said amorphous silicon at a reaction rate of not less than 10 m/sec and wherein a film-formed surface is produced without being exposed to an oxygen atmosphere between a step of forming said amorphous silicon and a step of forming said metal.

38. The semiconductor device utilizing the silicide reaction according to claim 37, wherein said amorphous silicon layer is an ion implanted layer.

39. The semiconductor device utilizing the silicide reaction according to claim 38, wherein said amorphous silicon layer is a layer ion-implanted through said metal.

40. The semiconductor device utilizing the silicide reaction according to claim 37, wherein a surface of said semiconductor device is covered with an insulating layer formed at a film-forming temperature of not more that 250° C.

41. The semiconductor device utilizing the silicide reaction according to claim 37, wherein an electric current flows into said amorphous silicon layer through said pair of conductors to cause the silicide reaction between said metal and said amorphous silicon, thereby creating an electrical short-circuit between said pair of conductors.

42. The semiconductor device utilizing the silicide reaction according to claim 41, wherein said electric current flows from said amorphous silicon layer into said metal.

43. The semiconductor device utilizing the silicide reaction according to claim 37, wherein said pair of conductors each comprise a metal.

44. The semiconductor device utilizing the silicide reaction according to claim 37, wherein said metal is a high-melting-point metal, an alloy containing a high-melting-point metal, or a compound of a high-melting-point metal.

45. The semiconductor device utilizing the silicide reaction according to claim 37, wherein said metal comprises at least one of W, Ta, Ti, Co, Mo, Hf, Ni, Zr, Cr, V, Pd, and Pt.

46. The semiconductor device utilizing the silicide reaction according to claim 37, which is formed in self alignment.

47. The semiconductor device utilizing the silicide reaction according to claim 37, which is formed in self alignment by selective growth technology of metal or semiconductor.

48. The semiconductor device utilizing the silicide reaction according to claim 47, which is formed in self alignment by selective growth of W or Ti, and selective growth technology of silicon.

49. The semiconductor device utilizing the silicide reaction according to claim 37, which comprises means for electrically detecting a change of a resistance between said pair of conductors.

50. The semiconductor device utilizing the silicide reaction according to claim 37, which has means for detecting a change in resistance between said pair of conductors due to said silicide reaction when the change is detected.

51. The semiconductor device utilizing the silicide reaction according to claim 37, wherein said cell has a second semiconductor region with a rectifying property positioned between said semiconductor layer and said conductor, or on an opposite side to said semiconductor layer, of said conductor.

52. The semiconductor device utilizing the silicide reaction according to claim 51, wherein a structure having said rectifying property is a pn junction.

53. The semiconductor device utilizing the silicide reaction according to claim 51, wherein a structure having said rectifying property is a Schottky junction.

54. The semiconductor device utilizing the silicide reaction according to claim 51, wherein said second semiconductor region has a structure having a smaller resistivity than that of said semiconductor layer.

55. The semiconductor device utilizing the silicide reaction according to claim 54, wherein said semiconductor layer comprises nondoped amorphous silicon or amorphous silicon doped with a selected amount of boron, and wherein said second semiconductor region comprises silicon doped with an impurity.

56. The semiconductor device utilizing the silicide reaction according to claim 51, which has such a structure that said second semiconductor region comprises a semiconductor material having a slower silicide reaction rate than that of said first semiconductor region.

57. The semiconductor device utilizing the silicide reaction according to claim 56, wherein said semiconductor layer is amorphous silicon formed by ion implantation, and wherein said second semiconductor region is an amorphous silicon deposited film deposited by a vapor phase method, or crystalline silicon.

58. The semiconductor device utilizing the silicide reaction according to claim 51, wherein a portion, in contact with said second semiconductor, of the conductor adjacent to said second semiconductor region of said pair of conductors is formed of a metal not to react with said second semiconductor region, thereby not forming a silicide layer.

59. The semiconductor device utilizing the silicide reaction according to claim 37, wherein a plurality of first conductive lines and a plurality of second conductive lines are arranged in a matrix, and wherein said cells are provided in portions where said plurality of first and second conductive lines intersect.

60. The semiconductor device utilizing the silicide reaction according to claim 59, wherein said first conductive lines and said conductors in contact therewith are formed of the same material, and/or wherein said second conductive lines and said conductors in contact therewith are formed of the same material.

61. The semiconductor device utilizing the silicide reaction according to claim 49, wherein said means for electrically detecting has means for inhibiting detection of the change of the resistance between said pair of conductors.

62. The semiconductor device utilizing the silicide reaction according to claim 37, wherein said semiconductor device is a read only memory.

63. The semiconductor device utilizing the silicide reaction according to claim 62, wherein said read only memory can store data of at least 1 Gbits.

64. The semiconductor device utilizing the silicide reaction according to claim 62, wherein said read only memory is arranged to read out data in 20 nsec or less.

65. The semiconductor device utilizing the silicide reaction according to claim 37, wherein electrical connection and insulation between arbitrary lines can be arbitrarily determined by said silicide reaction after completion of the fabrication process, whereby a circuit function of a programmable logic array (PLA) or field programmable gate array (FPGA) can be arbitrarily set.

66. The semiconductor device utilizing the silicide reaction according to claim 37, wherein connection and insulation of a gate electrode of a MOS transistor with a power supply or a ground electrode can be arbitrarily determined by said silicide reaction after completion of the fabrication process.

67. The semiconductor device utilizing the silicide reaction according to claim 37, wherein connection and insulation of a source electrode or/and a drain electrode of a MOS transistor with a power supply or a ground electrode can be arbitrarily determined by said silicide reaction after completion of the fabrication process.

68. The semiconductor device utilizing the silicide reaction according to claim 37, which comprises a neuron MOS transistor having a semiconductor region of one conductivity type on a substrate, source and drain regions of the opposite conductivity type provided in said region, a floating gate electrode provided through an insulating film in a region for separating said source and drain regions and being in a potentially floating state, and a plurality of input gate electrodes capacitance-coupling through an insulating film with said floating gate electrode, wherein connection and insulation of said plurality of input gate electrodes with a power supply or a ground electrode can be arbitrarily determined by said silicide reaction after completion of fabrication process.

69. The semiconductor device utilizing the silicide reaction according to claim 37, wherein said silicide reaction is let to take place while cooling the substrate with a liquid or gas.

* * * * *

UNITED STATES PATENT AND TRADEMARK OFFICE
CERTIFICATE OF CORRECTION

PATENT NO.    : 6,051,851
DATED         : April 18, 2000
INVENTOR(S)   : TADAHIRO OHMI ET AL.                    Page 1 of 2

It is certified that error appears in the above-identified patent and that said Letters Patent is hereby corrected as shown below:

ON THE TITLE PAGE:

[73] Assignees:

"Tadahiro Ohmi, Niyagi-ken," should read
--Tadahiro Ohmi, Sendai,--; and

[56] References Cited, under FOREIGN PATENT DOCUMENTS

"36679" should read --3-6679--.

COLUMN 1:

Line 31, "devices" should read --devices,--.

COLUMN 2:

Line 29, "the" (first occrrence) should be deleted;
Line 40, "Is" should read --is--; and
Line 56, "to" should be deleted.

COLUMN 5:

Line 61, "includes" should read --include--.

COLUMN 6:

Line 13, "is that" should read --so that--.

UNITED STATES PATENT AND TRADEMARK OFFICE
CERTIFICATE OF CORRECTION

PATENT NO. : 6,051,851
DATED : April 18, 2000
INVENTOR(S) : TADAHIRO OHMI ET AL.

It is certified that error appears in the above-identified patent and that said Letters Patent is hereby corrected as shown below:

COLUMN 12:

Line 60, "forming the" should read --forming--.

COLUMN 18:

Line 61, "limited" should read --so limited--; and
  Line 62, "to it." should be deleted.

COLUMN 28:

Line 20, "that" should read --than--.

COLUMN 30:

Line 42, "that" should read --than--.

Signed and Sealed this

Twenty-second Day of May, 2001

Attest:

NICHOLAS P. GODICI

*Attesting Officer*      Acting Director of the United States Patent and Trademark Office